US012272767B2

(12) United States Patent
Sung et al.

(10) Patent No.: US 12,272,767 B2
(45) Date of Patent: *Apr. 8, 2025

(54) ULTRAVIOLET LIGHT EMITTING ELEMENT AND LIGHT EMITTING ELEMENT PACKAGE INCLUDING THE SAME

(71) Applicant: Photon Wave Co., Ltd., Gyeonggi-do (KR)

(72) Inventors: Youn Joon Sung, Gyeonggi-do (KR); Seung Kyu Oh, Gyeonggi-do (KR); Jae Bong So, Gyeonggi-do (KR); Gil Jun Lee, Gyeonggi-do (KR); Won Ho Kim, Gyeonggi-do (KR); Tae Wan Kwon, Seoul (KR); Eric Oh, Gyeonggi-do (KR); Il Gyun Choi, Gyeonggi-do (KR); Jin Young Jung, Gyeonggi-do (KR)

(73) Assignee: Photon Wave Co., Ltd., Gyeonggi-do (KR)

( * ) Notice: Subject to any disclaimer, the term of this patent is extended or adjusted under 35 U.S.C. 154(b) by 67 days.

This patent is subject to a terminal disclaimer.

(21) Appl. No.: 18/195,962

(22) Filed: May 11, 2023

(65) Prior Publication Data
US 2023/0282769 A1 Sep. 7, 2023

Related U.S. Application Data

(63) Continuation of application No. 17/178,261, filed on Feb. 18, 2021, now Pat. No. 11,682,747.

(30) Foreign Application Priority Data

Sep. 4, 2020 (KR) .......................... 10-2020-0113153
Sep. 23, 2020 (KR) .......................... 10-2020-0123099

(51) Int. Cl.
  *H01L 33/20* (2010.01)
  *H01L 27/15* (2006.01)
  (Continued)

(52) U.S. Cl.
  CPC ............ *H01L 33/14* (2013.01); *H01L 27/153* (2013.01); *H01L 33/20* (2013.01); *H01L 33/38* (2013.01);
  (Continued)

(58) Field of Classification Search
  CPC ........... H01L 27/153; H01L 2933/0016; H01L 33/007; H01L 33/14; H01L 33/20;
  (Continued)

(56) References Cited

U.S. PATENT DOCUMENTS

2004/0159836 A1    8/2004   Sugimoto et al.
2007/0085095 A1*   4/2007   Ko ......................... H01L 33/38
                                                                     257/94
(Continued)

FOREIGN PATENT DOCUMENTS

CN    109390446    2/2019
CN    111129248    5/2020
(Continued)

OTHER PUBLICATIONS

International Search Report and the Written Opinion Dated Jun. 18, 2021 From the International Searching Authority Re. Application No. PCT/KR2020/017786. (3 Pages).
(Continued)

Primary Examiner — Julia Slutsker
Assistant Examiner — Dmitriy Yemelyanov

(57) ABSTRACT

An embodiment discloses an ultraviolet light emitting element including: a light emitting structure including a first conductive semiconductor layer, a second conductive semiconductor layer, an active layer disposed between the first
(Continued)

conductive semiconductor layer and the second conductive semiconductor layer, and an etched region in which the first conductive semiconductor layer is exposed; a first insulating layer disposed on the light emitting structure and including a first hole which exposes a portion of the etched region; a first electrode electrically connected to the first conductive semiconductor layer; and a second electrode electrically connected to the second conductive semiconductor layer, wherein the light emitting structure includes an intermediate layer regrown on the first conductive semiconductor layer exposed in the first hole, the first electrode is disposed on the intermediate layer, the etched region includes a first etched region disposed at an inner side and a second etched region disposed at an outer side based on an outer side surface of the first electrode, and a ratio of an area of the first etched region and an area of the intermediate layer is 1:0.3 to 1:0.7, and a light emitting element package including the same.

13 Claims, 15 Drawing Sheets

(51) Int. Cl.
    *H01L 33/14*     (2010.01)
    *H01L 33/38*     (2010.01)
    *H01L 33/40*     (2010.01)
    *H01L 33/44*     (2010.01)
    *H01L 33/32*     (2010.01)

(52) U.S. Cl.
    CPC ............ *H01L 33/405* (2013.01); *H01L 33/44* (2013.01); *H01L 33/32* (2013.01)

(58) Field of Classification Search
    CPC ....... H01L 33/32; H01L 33/38; H01L 33/405; H01L 33/44
    See application file for complete search history.

(56) References Cited

U.S. PATENT DOCUMENTS

| | | | |
|---|---|---|---|
| 2008/0185606 A1 | 8/2008 | Sano et al. | |
| 2013/0193464 A1 | 8/2013 | Bae et al. | |
| 2018/0240936 A1 | 8/2018 | Hong et al. | |
| 2018/0366613 A1 | 12/2018 | Jang et al. | |
| 2019/0051797 A1* | 2/2019 | Sung | H01L 33/38 |
| 2019/0067524 A1 | 2/2019 | Sung et al. | |
| 2019/0237623 A1* | 8/2019 | Sung | H01L 33/32 |
| 2022/0077348 A1 | 3/2022 | Sung et al. | |

FOREIGN PATENT DOCUMENTS

| | | | | |
|---|---|---|---|---|
| JP | 2012-166332 | | 9/2012 | |
| JP | 2016-526801 | | 9/2016 | |
| JP | 2019-106406 | | 6/2019 | |
| KR | 2016-0103687 | | 9/2016 | |
| KR | 10-2017-0133974 | | 12/2017 | |
| KR | 2019-0018325 | | 2/2019 | |
| KR | 2020-0065872 | | 6/2020 | |
| TW | 201336121 | | 9/2013 | |
| TW | 201921742 | | 6/2019 | |
| WO | WO 2012/107973 | | 8/2012 | |
| WO | WO-2012107973 A1 * | 8/2012 | ............. H01L 33/40 |
| WO | WO-2015068980 A1 * | 5/2015 | ............. H01L 33/38 |
| WO | WO WO 2015/068980 | | 5/2015 | |

OTHER PUBLICATIONS

Notice of Allowance Dated Mar. 28, 2023 from U.S. Appl. No. 17/178,261. (6 pages).

Notice of Reason for Rejection Dated Dec. 13, 2021 From the Japan Patent Office Re. Application No. 2021-023701. (5 Pages).

Office Action Dated Oct. 12, 2021 From the Taiwan Intellectual Property Office, Ministry of Economic Affaires Re. Application No. 110105364. (3 Pages).

Office Section Dated Oct. 25, 2021 From the Korean Intellectual Property Office Re. Application No. 10-2020-0123099.

Official Action Dated Oct. 13, 2022 from U.S. Appl. No. 17/178,261. (23 pages).

Notification of Office Action and Search Report Dated Sep. 23, 2023 From the National Intellectual Property Administration, People's Republic of China Re. Application No. 2021101820506 and Its Translation of Office Action Into English. (12 Pages).

\* cited by examiner

[Fig. 1]
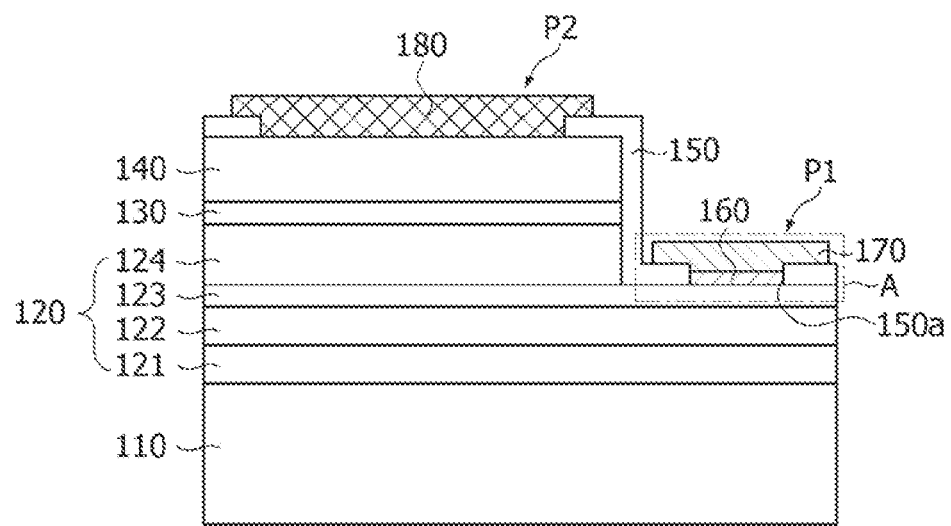
[Fig. 2]
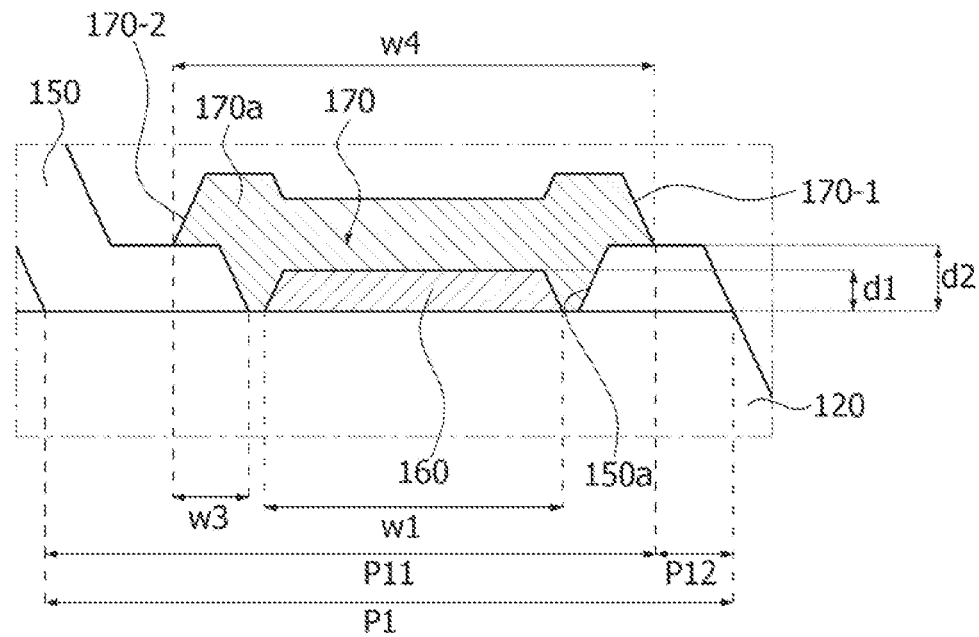

[Fig. 3]
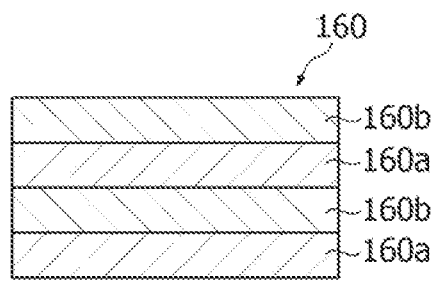
[Fig. 4]
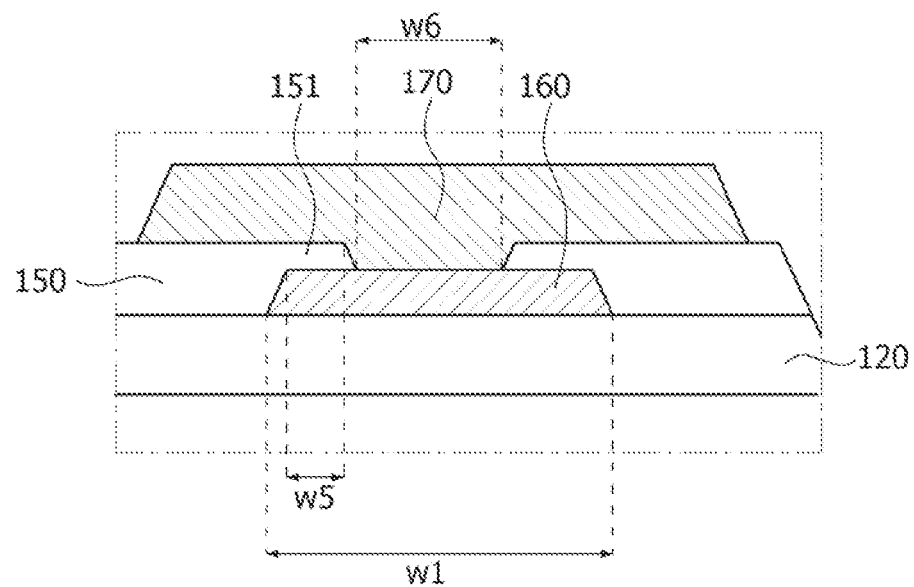

[Fig. 5]
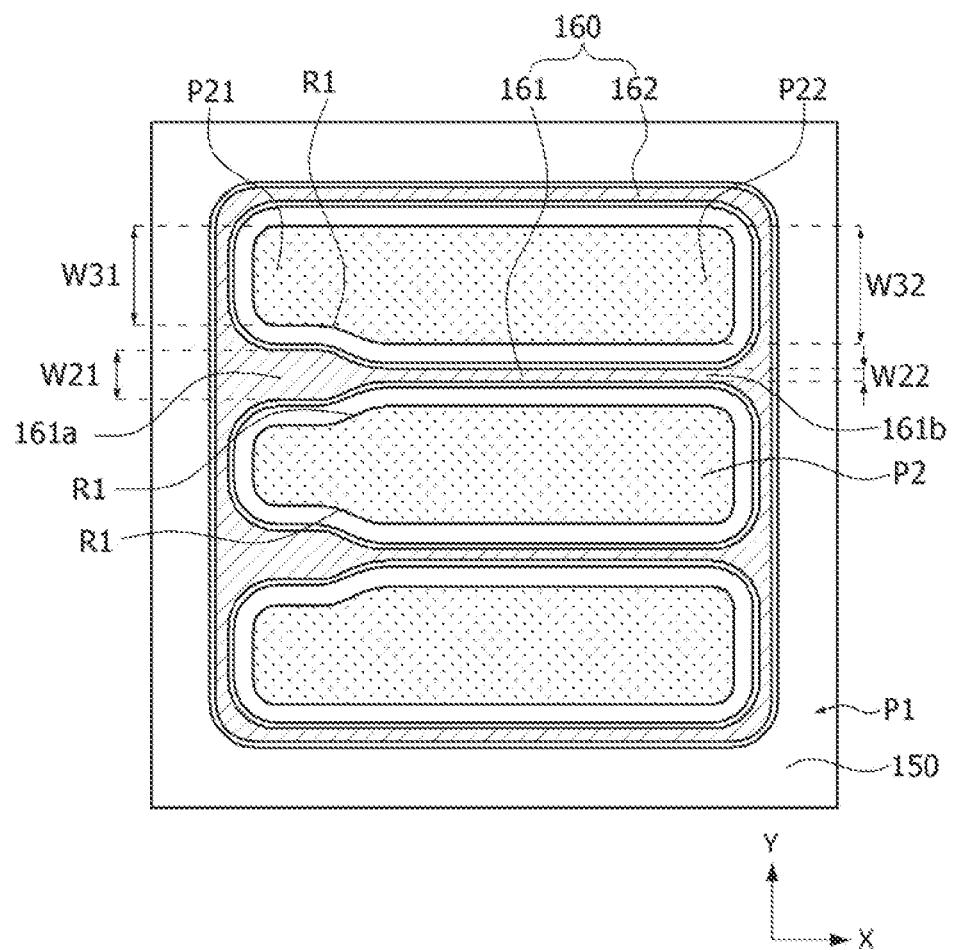

[Fig. 6]
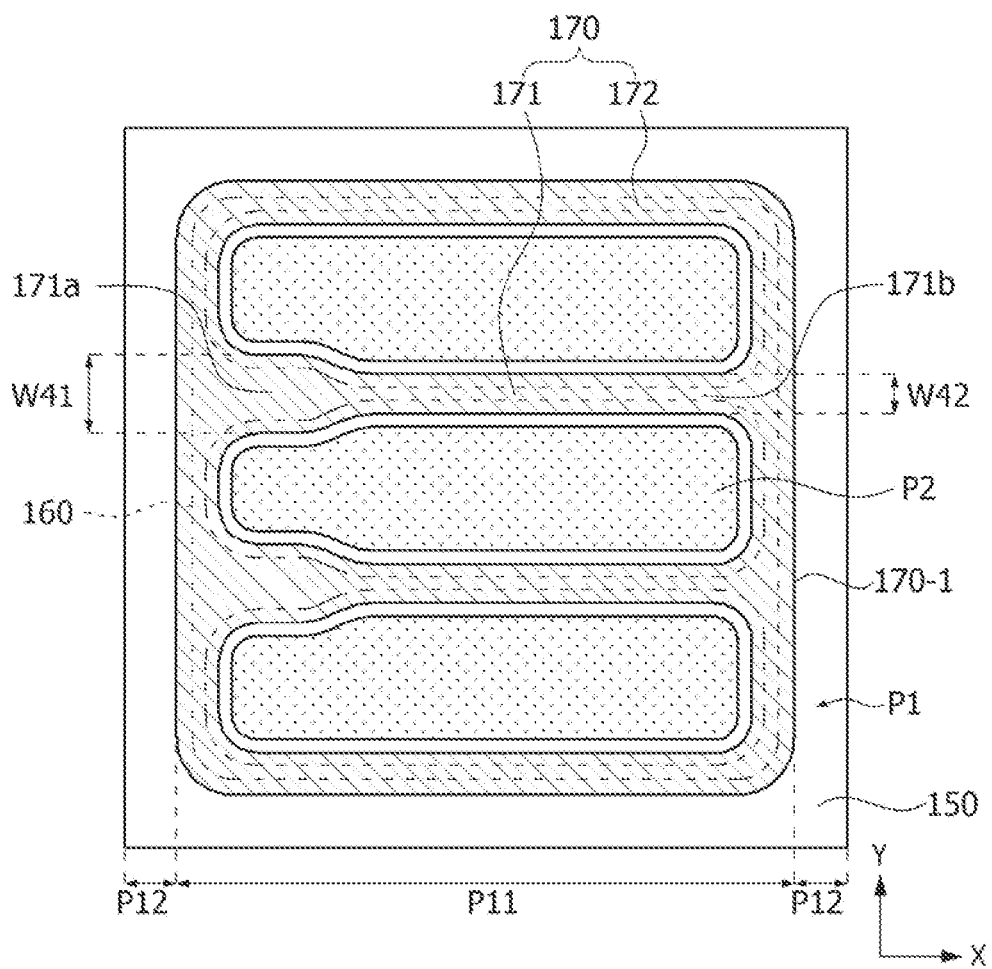

[Fig. 7]
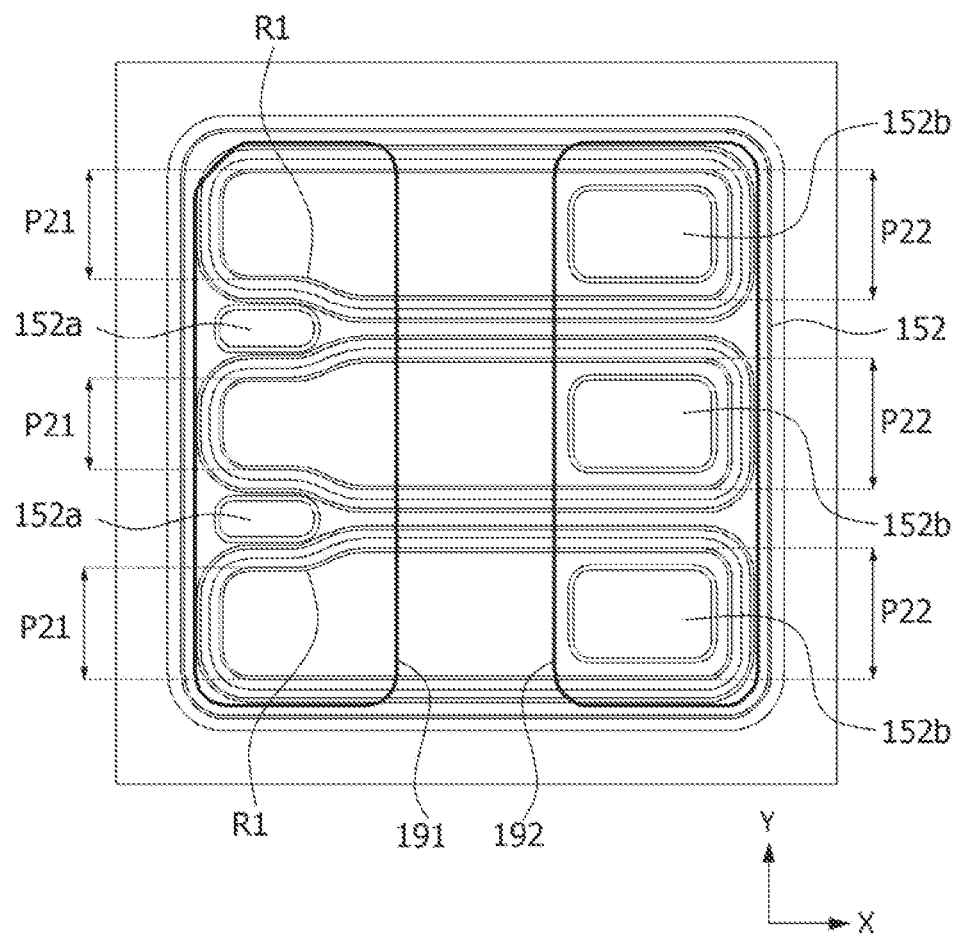

[Fig. 8a]
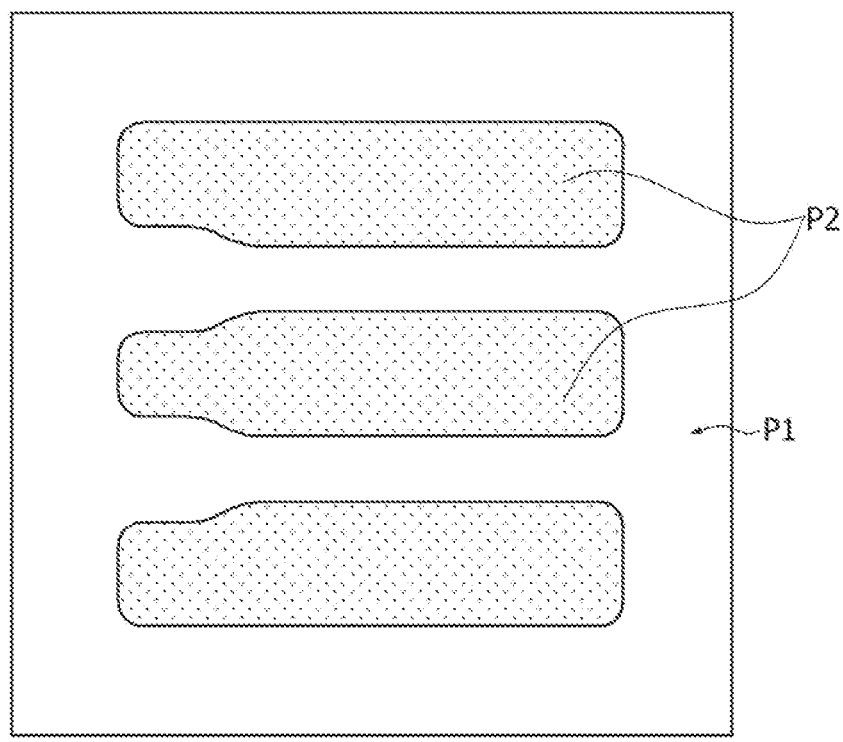
[Fig. 8b]
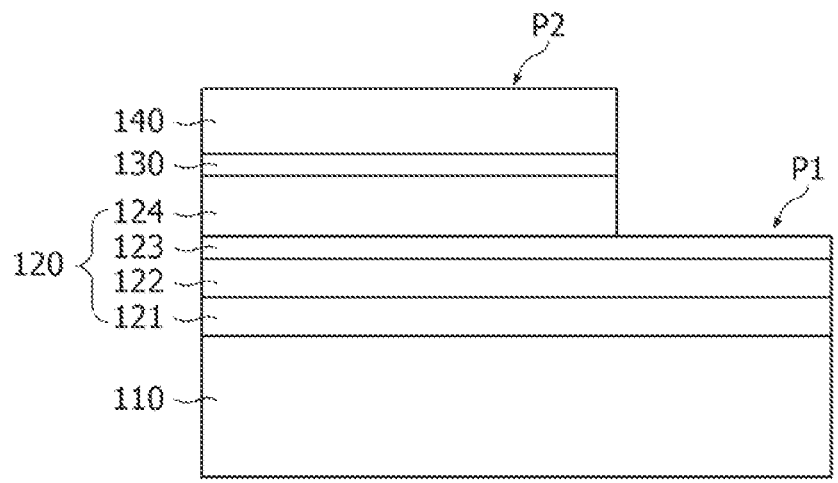

[Fig. 9a]
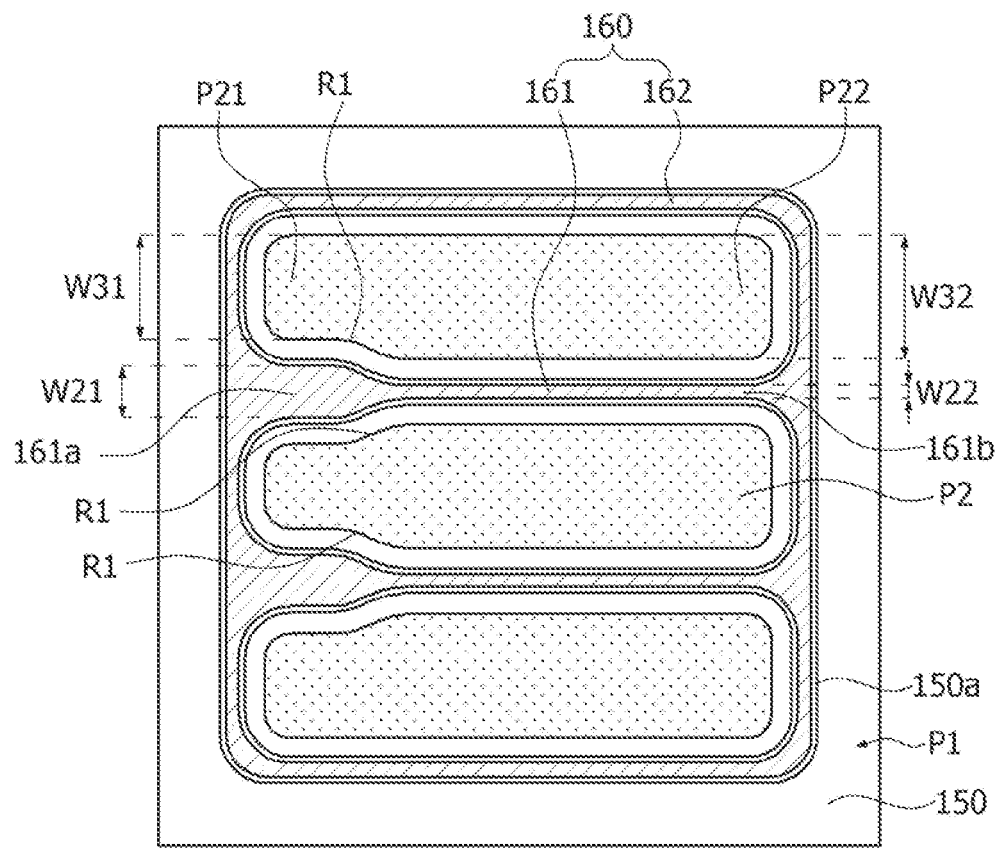
[Fig. 9b]
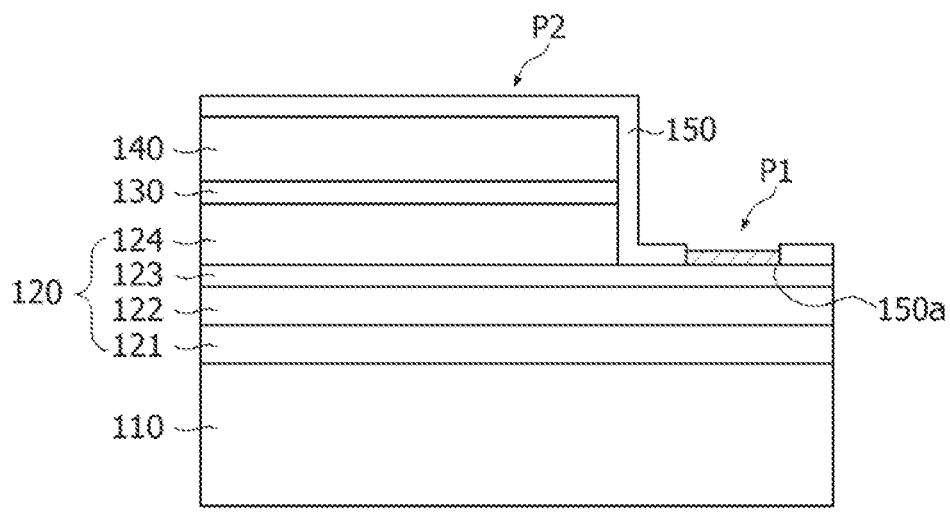

[Fig. 10a]
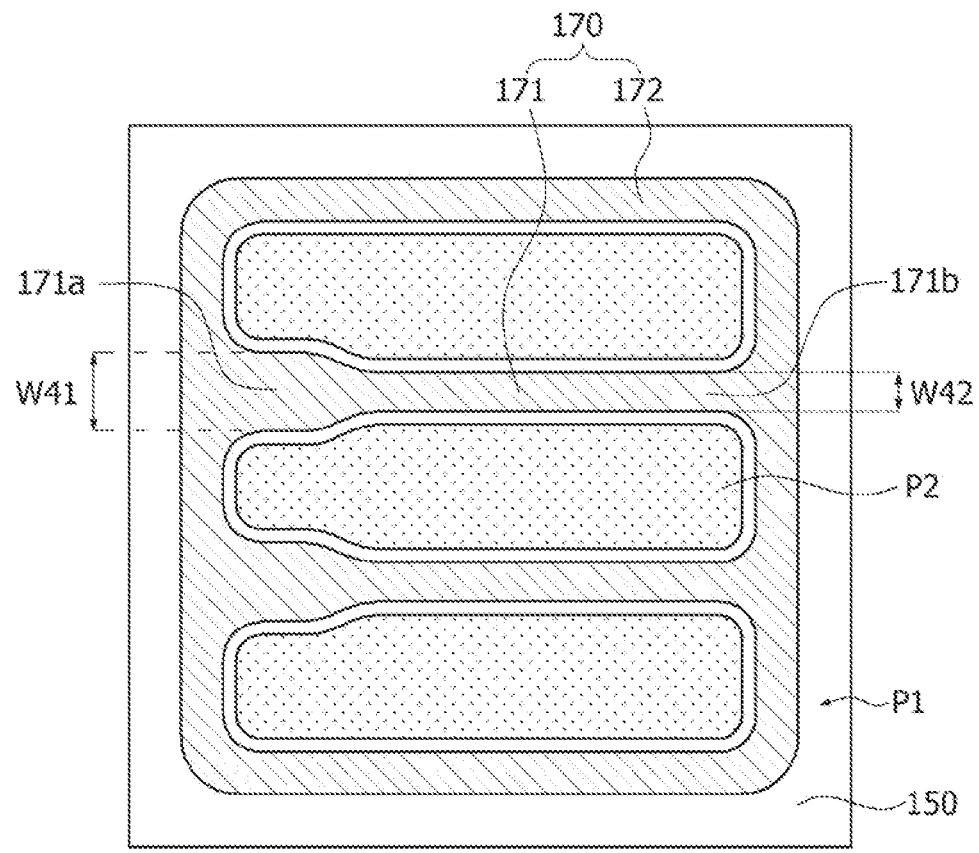
[Fig. 10b]
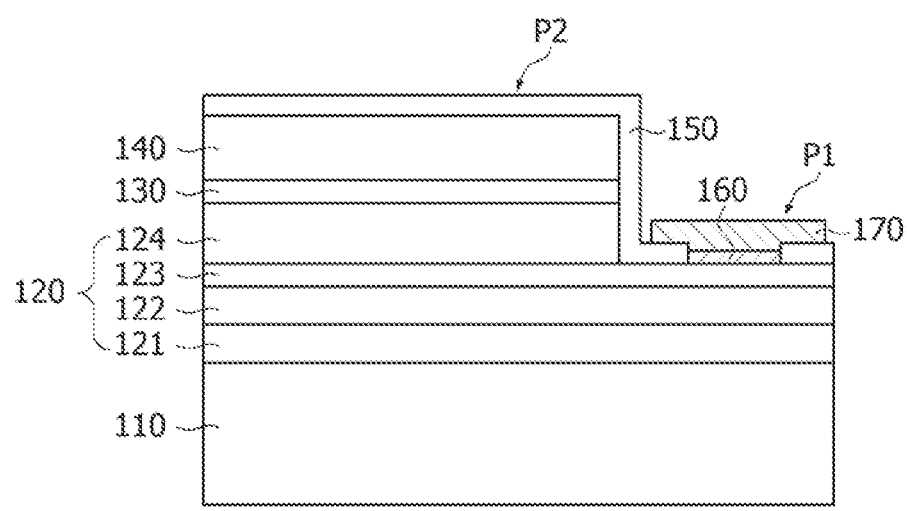

[Fig. 11a]
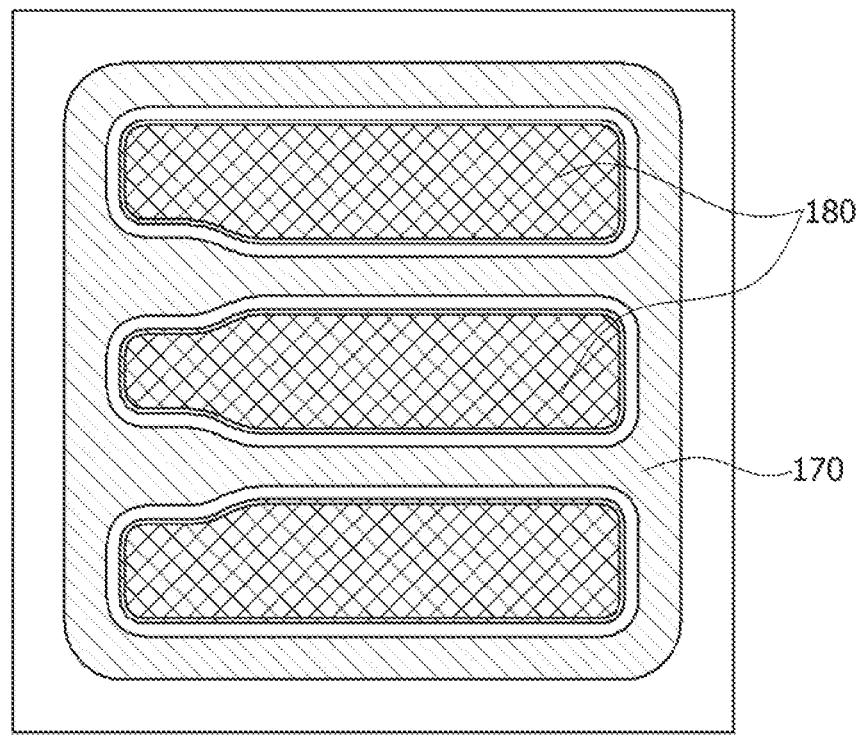
[Fig. 11b]
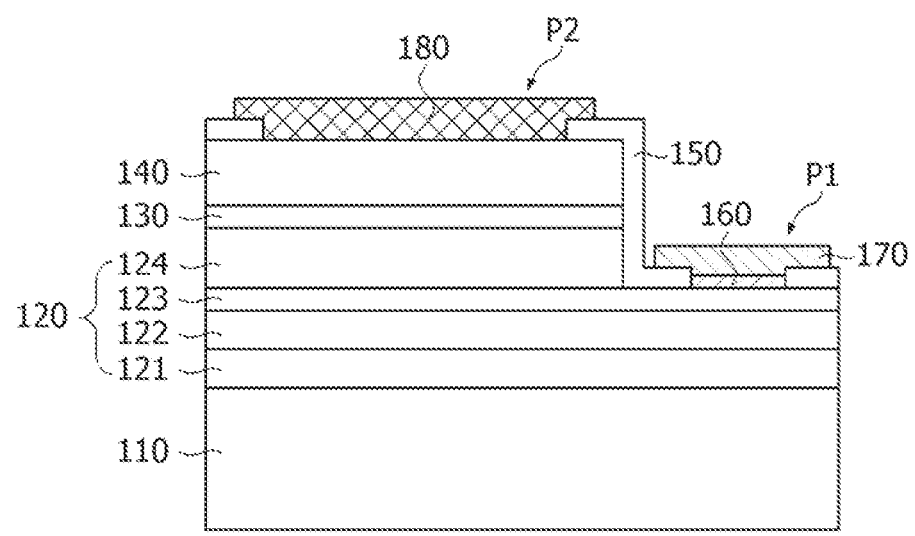

[Fig. 12a]
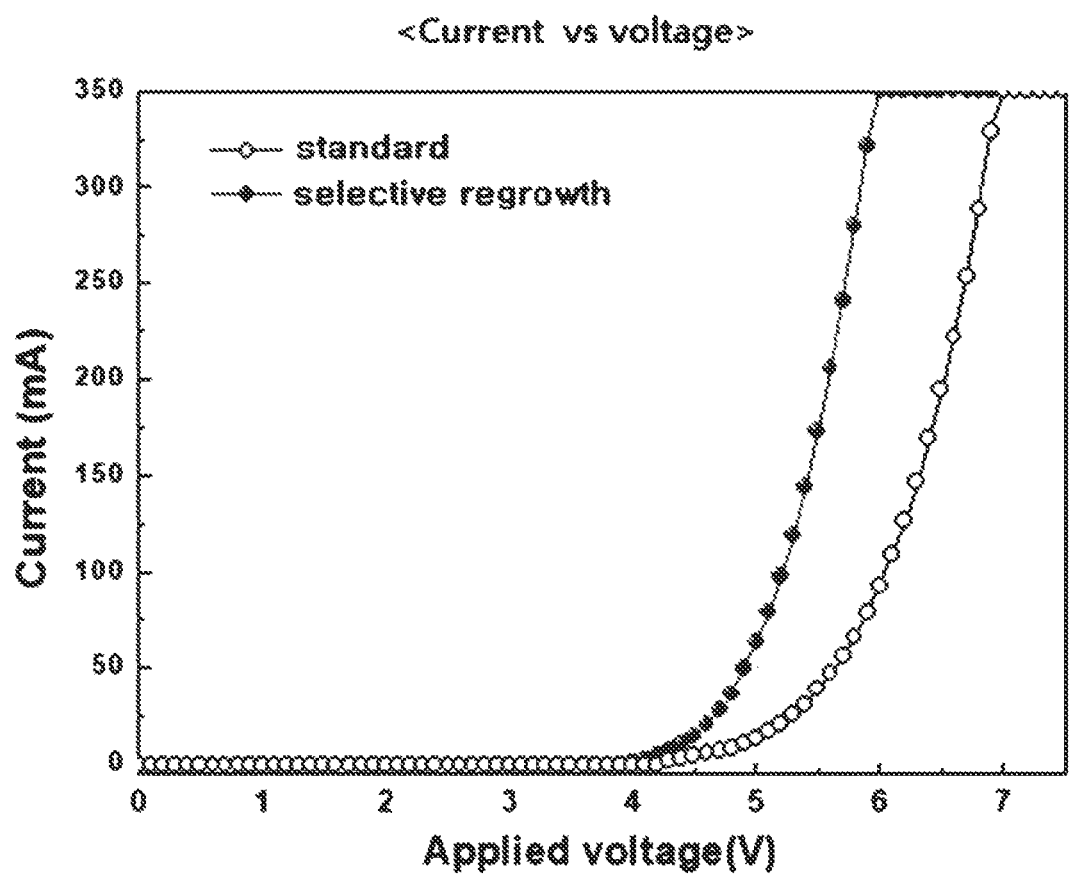

[Fig. 12b]
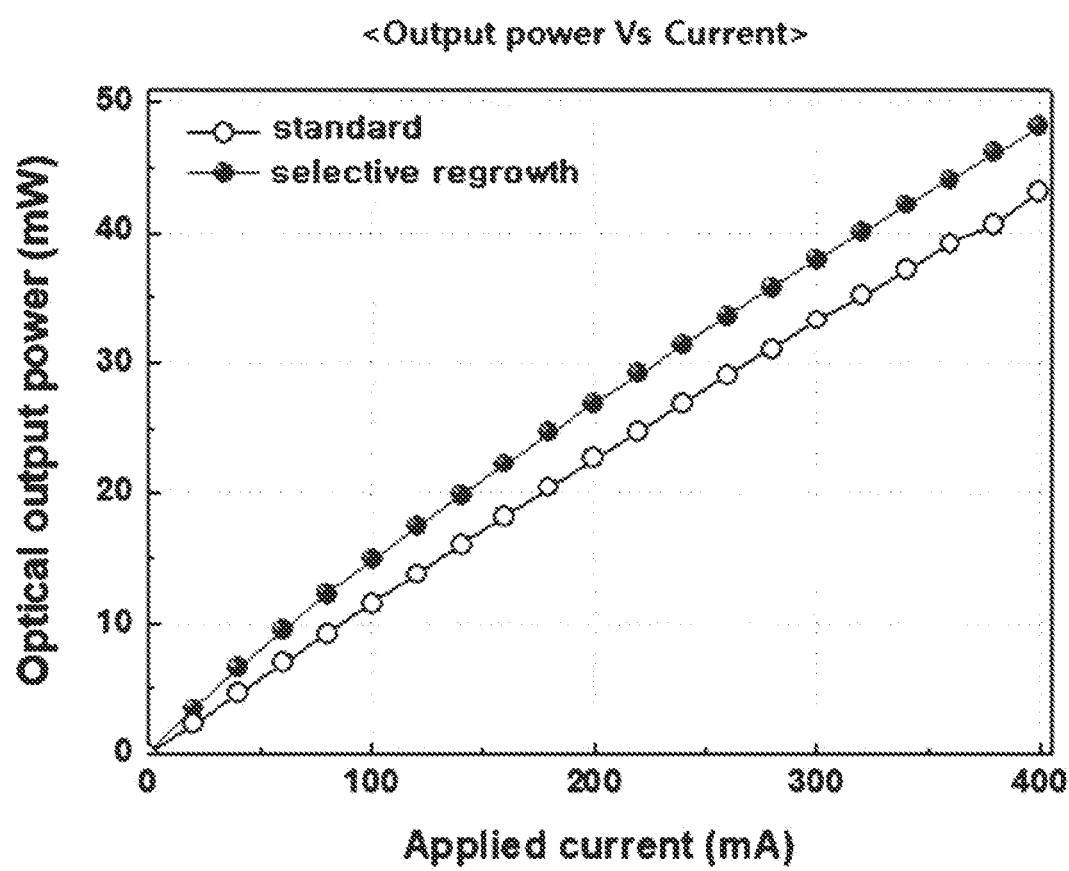

[Fig. 13]
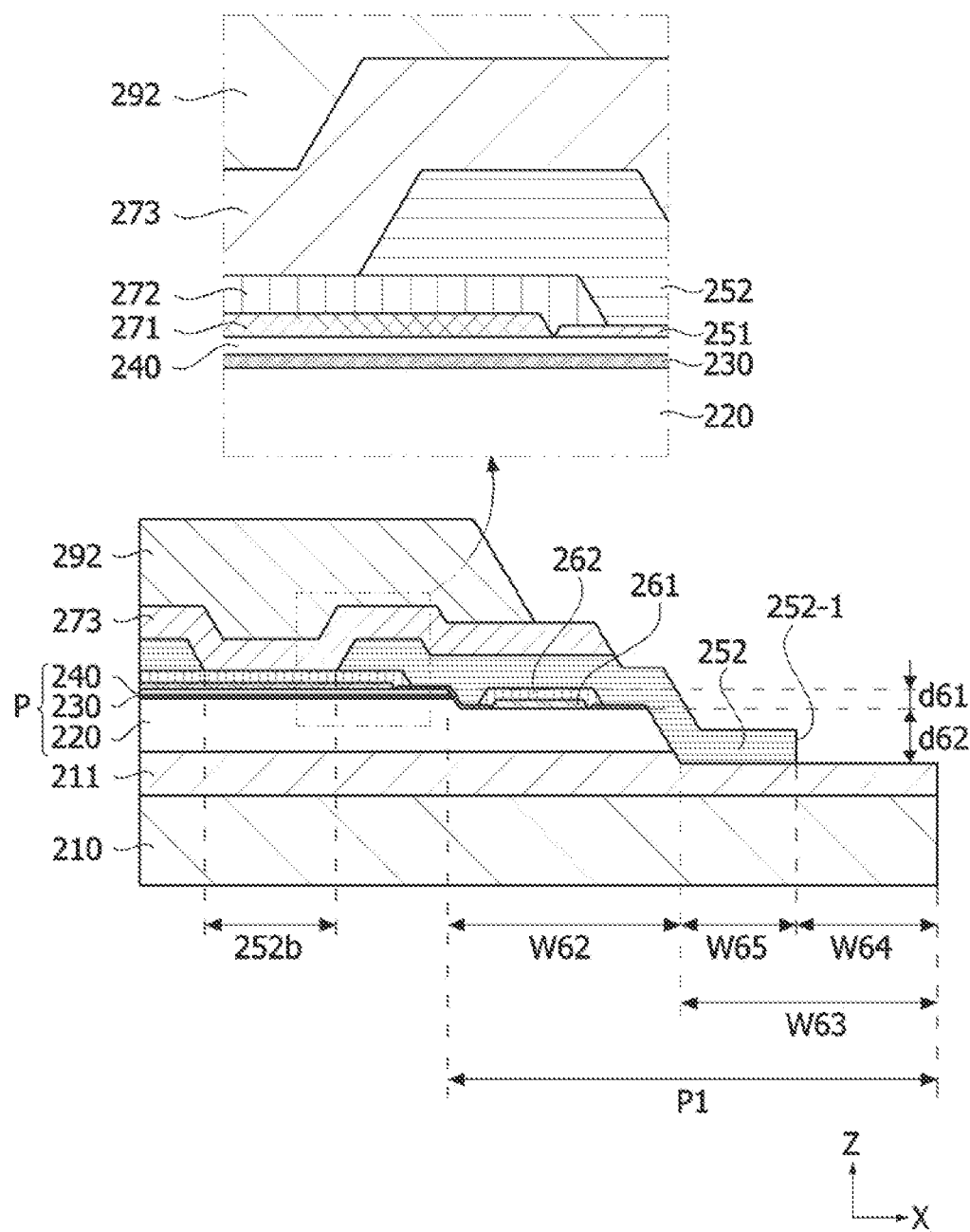

[Fig. 14]
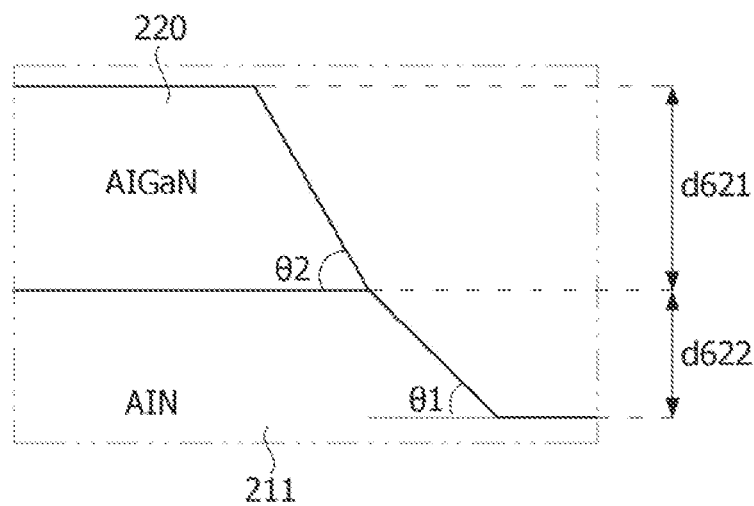
[Fig. 15]
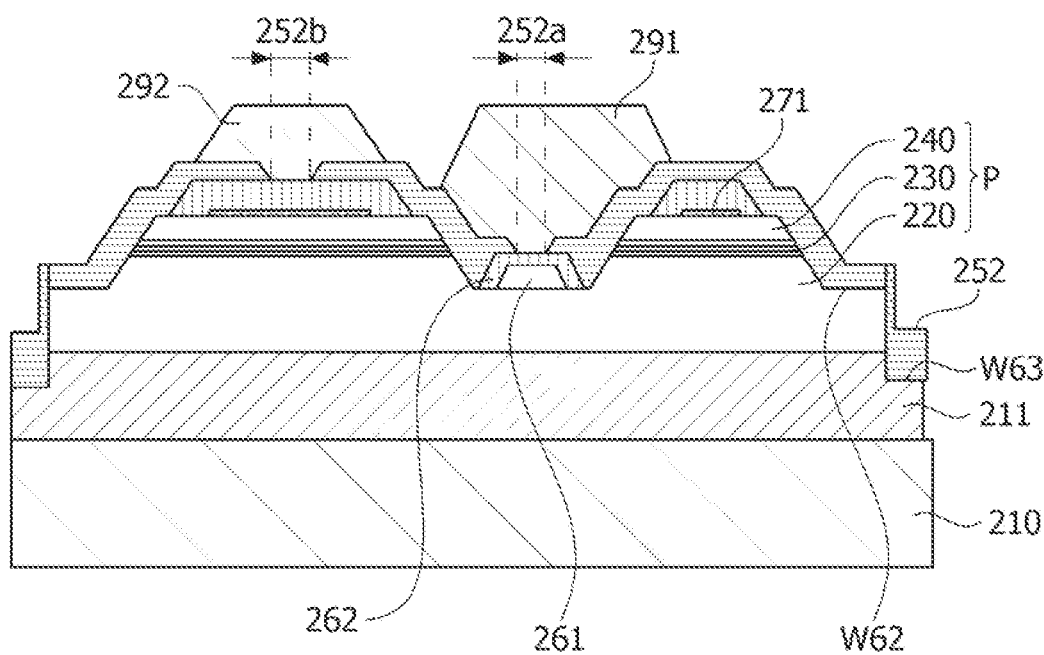

[Fig. 16]
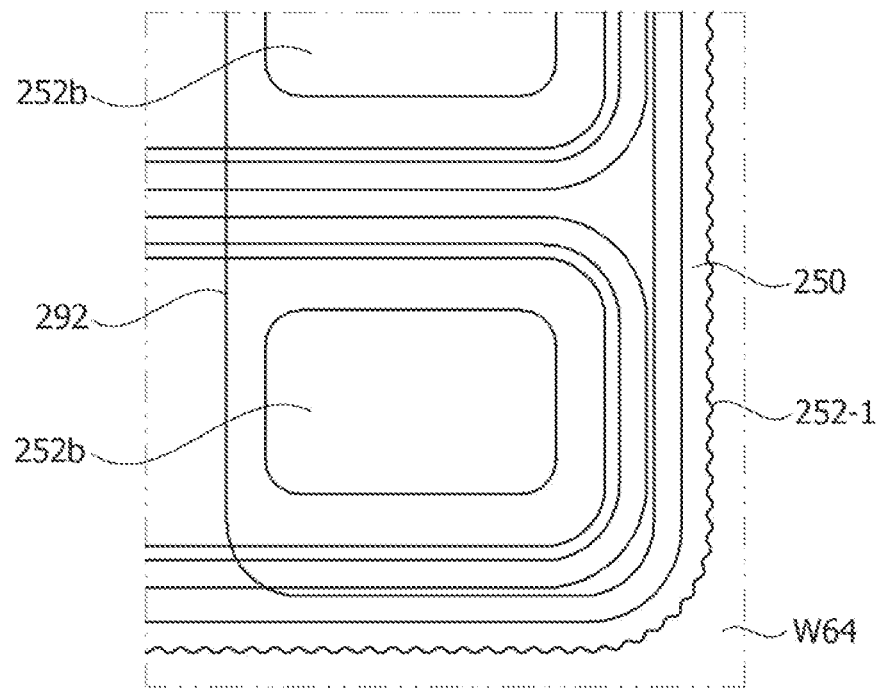
[Fig. 17a]
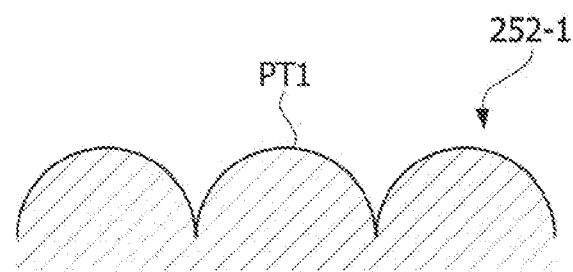
[Fig. 17b]
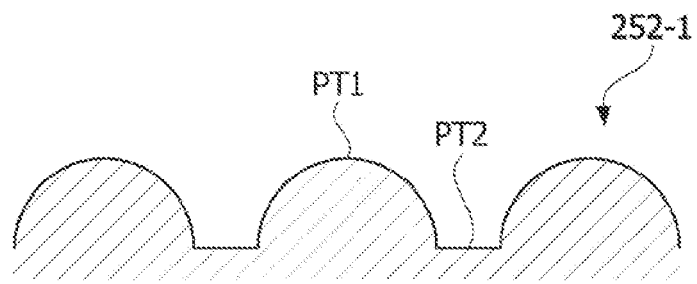

[Fig. 17c]
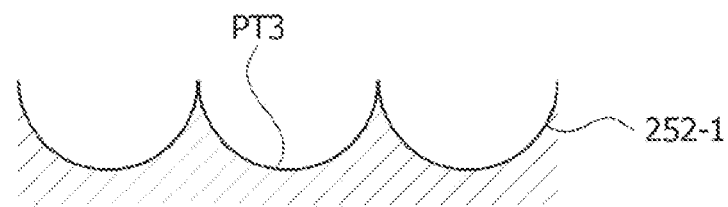
[Fig. 17d]
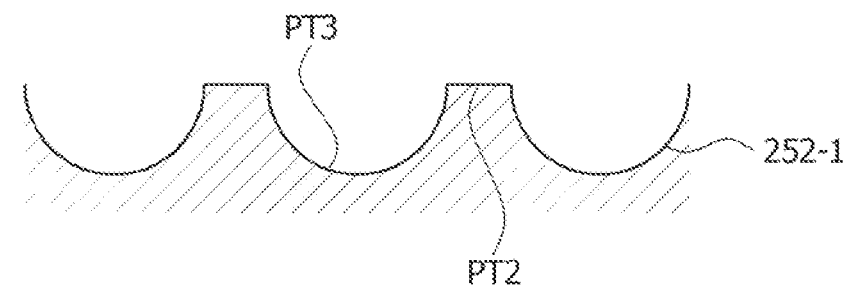
[Fig. 17e]
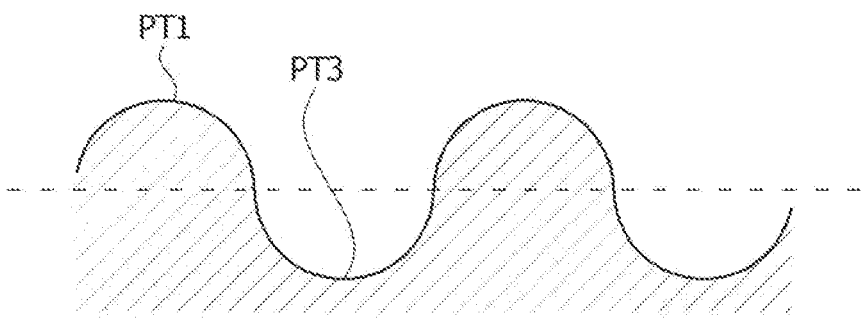

ULTRAVIOLET LIGHT EMITTING ELEMENT AND LIGHT EMITTING ELEMENT PACKAGE INCLUDING THE SAME

RELATED APPLICATIONS

This application is a Continuation of U.S. patent application Ser. No. 17/178,261, filed on Feb. 18, 2021, which claims the benefit of priority of Korean Patent Application Nos. 10-2020-0123099 filed on Sep. 23, 2020 and 10-2020-0113153 filed on Sep. 4, 2020, the contents of which are incorporated herein by reference in their entirety.

FIELD AND BACKGROUND OF THE INVENTION

Embodiments relate to an ultraviolet light emitting element and a light emitting element package including the same.

A light emitting diode (LED) is an important solid-state element which converts electrical energy into light, and generally includes an active layer of a semiconductor material interposed between two opposite doped layers. When a bias is applied to both ends of two doped layers, holes and electrons are injected into the active layer and then recombined to generate light. The light generated in an active region is emitted in all directions and escapes out of a semiconductor chip through all exposed surfaces. Packaging of the LED is generally used to direct the escaping light in a desired output emission type.

Recently, since application fields expand and demand for high-power UV LED products increases, a lot of research and development is being conducted to enhance optical output.

Recently, an ultraviolet (UV) LED in which interest increases as demands for water treatment and sterilization products sharply increase can be manufactured by growing a buffer layer, an n-type semiconductor layer, an active layer, and a p-type semiconductor layer on a sapphire substrate or the like.

However, in the UV LED, since an AlGaN layer having a high aluminum composition is used, there is a problem in that an operating voltage increases due to difficulty in ohmic contact between the n-type semiconductor, the p-type semiconductor, and a metal electrode and there is a problem in that light extraction efficiency is degraded as the metal electrode does not sufficiently reflect the ultraviolet light.

SUMMARY OF THE INVENTION

An embodiment is directed to providing a light emitting element of which an operating voltage is lowered and a light emitting element package including the same.

Further, an embodiment is directed to providing a light emitting element of which optical output is improved and a light emitting element package including the same.

In addition, an embodiment is directed to providing a light emitting element which is resistant to corrosion and a light emitting element package including the same.

In addition, an embodiment is directed to providing a light emitting element capable of blocking propagation of cracks and a light emitting element package including the same.

Problems to be solved by the embodiments are not limited to the above-described problems, and purposes and effects understood from the solutions and embodiments which will be described below are also included.

According to an aspect of the present disclosure, there is provided an ultraviolet light emitting element including: a light emitting structure including a first conductive semiconductor layer, a second conductive semiconductor layer, an active layer disposed between the first conductive semiconductor layer and the second conductive semiconductor layer, and an etched region in which the first conductive semiconductor layer is exposed; a first insulating layer disposed on the light emitting structure and including a first hole which exposes a portion of the etched region; a first electrode electrically connected to the first conductive semiconductor layer; and a second electrode electrically connected to the second conductive semiconductor layer, wherein the light emitting structure includes an intermediate layer regrown on the first conductive semiconductor layer exposed in the first hole, the first electrode is disposed on the intermediate layer, the etched region includes a first etched region disposed at an inner side and a second etched region disposed at an outer side based on an outer side surface of the first electrode, and a ratio of an area of the first etched region and an area of the intermediate layer is 1:0.3 to 1:0.7.

A thickness of the intermediate layer may be smaller than a thickness of the first insulating layer.

A ratio of the thickness of the first insulating layer and the thickness of the intermediate layer is 1:0.03 to 1:0.5.

The first insulating layer may include a first extending portion extending to an upper portion of the intermediate layer.

The first electrode may include a second extending portion extending to an upper portion of the first insulating layer, and a width of the second extending portion may be 5 μm to 15 μm.

First intermediate layers and second intermediate layers having different aluminum compositions may be stacked multiple times in the intermediate layer, and the aluminum composition of each of the first intermediate layers may be higher than the aluminum composition of each of the second intermediate layers.

The first conductive semiconductor layer may include a first sub semiconductor layer, a second sub semiconductor layer disposed on the first sub semiconductor layer, a third sub semiconductor layer disposed on the second sub semiconductor layer, and a fourth sub semiconductor layer disposed on the third sub semiconductor layer, an aluminum composition of the second sub semiconductor layer may be lower than aluminum compositions of the first sub semiconductor layer and the fourth sub semiconductor layer, an aluminum composition of the third sub semiconductor layer may be lower than the aluminum composition of the second sub semiconductor layer, and the intermediate layer may be disposed on the third sub semiconductor layer.

An aluminum composition of the intermediate layer may be lower than the aluminum composition of the third sub semiconductor layer.

The light emitting structure may include a plurality of light emitting regions extending in a first direction and spaced apart from each other in a second direction perpendicular to the first direction, the intermediate layer may include a plurality of finger portions disposed between the plurality of light emitting regions and each having a first end and a second end and an edge portion extending along an edge of the etched region, and the edge portion may be connected to the first ends and the second ends of the plurality of finger portions.

A width of the first end may be greater than a width of the second end in each of the plurality of finger portions.

The first electrode may include a plurality of finger electrodes disposed between the plurality of light emitting regions and each having a first end and a second end and an edge electrode extending along an edge of the etched region, the edge electrode may be connected to the first ends and the second ends of the plurality of finger electrodes, and a width of the first end may be greater than a width of the second end in each of the plurality of finger electrodes.

The ultraviolet light emitting element may include a second insulating layer disposed on the first electrode and the second electrode, and including a first opening which exposes the first electrode and a second opening which exposes the second electrode, a first pad disposed on the second insulating layer and electrically connected to the first electrode through the first opening, and a second pad disposed on the second insulating layer and electrically connected to the second electrode through the second opening.

The first opening may be disposed on the first ends of the finger portions, and the second opening may be disposed on the second electrode.

Each of the plurality of light emitting regions may include a first end and a second end, the first end of each of the plurality of light emitting regions may include curved portions curved in directions receding from each other, and the first pad may overlap the curved portions of the plurality of light emitting regions.

According to another aspect of the present disclosure, there is provided an ultraviolet light emitting element including: a substrate; a buffer layer disposed on the substrate; a light emitting structure including a first conductive semiconductor layer disposed on the buffer layer, an active layer disposed on the first conductive semiconductor layer, a second conductive semiconductor layer disposed on the active layer, and a first etched region in which the first conductive semiconductor layer is exposed; a first electrode disposed on the first conductive semiconductor layer exposed to the first etched region; a second electrode disposed on the second conductive semiconductor layer; and an insulating layer disposed on the first electrode and the second electrode, wherein a side surface of the insulating layer includes a plurality of protrusions protruding to the outside.

The side surface of the insulating layer may include the plurality of protrusions and a plurality of straight portions disposed between the plurality of protrusions.

The light emitting structure may include a second etched region formed at the outside of the first etched region to expose the buffer layer, and the protrusions of the insulating layer may be formed in the second etched region.

An area of the second etched region may be larger than an area of the first etched region.

A depth of the second etched region may be greater than a depth of the first etched region.

A height of a side surface of the first conductive semiconductor layer exposed by the second etched region may be larger than a height of a side surface of the buffer layer exposed by the second etched region.

The second etched region may include a cover region in which the insulating layer is disposed, and a ratio of an area of the cover region and an area of the first etched region may be 1:3.5 to 1:6.0.

An inclination angle of the side surface of the first conductive semiconductor layer exposed to the second etched region may be larger than an inclination angle of the side surface of the buffer layer exposed to the second etched region.

BRIEF DESCRIPTION OF THE SEVERAL VIEWS OF THE DRAWINGS

The above and other objects, features and advantages of the present disclosure will become more apparent to those of ordinary skill in the art by describing in detail exemplary embodiments thereof with reference to the accompanying drawings, in which:

FIG. 1 is a conceptual diagram of a light emitting element according to one embodiment of the present disclosure;

FIG. 2 is an enlarged view of portion A in FIG. 1;

FIG. 3 is a view illustrating a stacking structure of an intermediate layer;

FIG. 4 is a modified example of FIG. 2;

FIG. 5 is a plan view illustrating the intermediate layer;

FIG. 6 is a plan view illustrating a first electrode;

FIG. 7 is a plan view of the light emitting element according to one embodiment of the present disclosure;

FIGS. 8A and 8B are a plan view and a cross-sectional view illustrating a state in which a light emitting region and an etched region are formed by mesa etching, respectively;

FIGS. 9A and 9B are a plan view and a cross-sectional view illustrating a state in which an intermediate layer is regrown on a first conductive semiconductor layer, respectively;

FIGS. 10A and 10B are a plan view and a cross-sectional view illustrating a state in which a first electrode is formed, respectively;

FIGS. 11A and 11B are a plan view and a cross-sectional view illustrating a state in which a second electrode is formed, respectively;

FIGS. 12A and 12B are graphs for describing an effect of improving an electrical characteristic (VF enhancement) and an optical characteristic (optical output enhancement) of a short wavelength ultraviolet light emitting diode (LED) (a peak wavelength of 265 nm) according to one embodiment of the present disclosure;

FIG. 13 is a conceptual diagram of a light emitting element according to another embodiment of the present disclosure;

FIG. 14 is a view illustrating inclination angles of a buffer layer and a first conductive semiconductor layer;

FIG. 15 is a cross-sectional view of the light emitting element according to another embodiment of the present disclosure;

FIG. 16 is a portion of the plan view of the light emitting element according to one embodiment of the present disclosure; and FIGS. 17A, 17B, 17C, 17D and 17E are views illustrating various shapes of a side surface of an insulating layer.

DESCRIPTION OF SPECIFIC EMBODIMENTS OF THE INVENTION

The embodiments may be modified into other forms or some of the embodiments may be combined, and the scope of the present disclosure is not limited to the embodiments which will be described below.

Although items described in a specific embodiment are not described in another embodiment, the items may be understood as a description related to the other embodiment unless a description contrary to or contradicting the items is in the other embodiment.

For example, when a characteristic of a component A is described in a specific embodiment and a characteristic of a component B is described in another embodiment, the characteristics of the components are understood to fall within the scope of the present disclosure unless a contrary or contradictory description is present even when an embodiment in which the component A and the component B are combined is not clearly disclosed.

In the description of the embodiments, when one element is disclosed to be formed "on or under" another element, the term "on or under" includes both a case in which the two elements are in direct contact with each other and a case in which at least one other element is disposed between the two elements (indirect contact). Further, when the term "on or under" is expressed, a meaning of not only an upward direction but also a downward direction with respect to one element may be included.

Hereinafter, embodiments of the present disclosure will be described in detail with reference to the accompanying drawings so that those skilled in the art may easily carry out the embodiment of the present disclosure.

FIG. 1 is a conceptual diagram of a light emitting element according to one embodiment of the present disclosure, FIG. 2 is an enlarged view of portion A in FIG. 1, FIG. 3 is a view illustrating a stacking structure of an intermediate layer, and FIG. 4 is a modified example of FIG. 2.

Referring to FIGS. 1 and 2, a light emitting structure according to the embodiment of the present disclosure may emit light in an ultraviolet wavelength band. For example, the light emitting structure may emit light in a near ultraviolet wavelength band (ultraviolet (UV)-A), may emit light in a far ultraviolet wavelength band (UV-B), and may emit light in a deep ultraviolet wavelength band (UV-C).

For example, the light in the near ultraviolet wavelength band (UV-A) may have a peak wavelength in a range from 320 nm to 420 nm, the light in the far ultraviolet wavelength band (UV-B) may have a peak wavelength in a range from 280 nm to 320 nm, and the light in the deep ultraviolet wavelength band (UV-C) may have a peak wavelength in a range from 100 nm to 280 nm.

When the light emitting structure (120, 130, and 140) emits light in an ultraviolet wavelength band, each layer of the light emitting structure may include a material having a composition formula of $In_{x1}Al_{y1}Ga_{1-x1-y1}N$ ($0 \le x1 \le 1$, $0 < y1 \le 1$, and $0 \le x1+y1 \le 1$) including aluminum. Here, an aluminum composition may be represented as a ratio of a total atomic weight including an atomic weight of In, an atomic weight of Ga, and an atomic weight of Al, and the atomic weight of Al. For example, when the aluminum composition is 40%, a Ga composition may be 60%, that is, the composition formula may be $Al_{0.4}Ga_{0.6}N$.

Further, in a description of the embodiment, a meaning that the composition is low or high may be understood as a difference in composition % of each semiconductor layer. For example, when an aluminum composition of a first semiconductor layer is 30% and an aluminum composition of a second semiconductor layer is 60%, the aluminum composition of the second semiconductor layer may be expressed as 30% higher than the aluminum composition of the first semiconductor layer.

A substrate 110 may be formed of a material selected from sapphire ($Al_2O_3$), SiC, GaAs, GaN, ZnO, Si, GaP, InP, and Ge, but is not limited thereto. The substrate 110 may be a transparent substrate through which light in an ultraviolet wavelength band may be transmitted.

A buffer layer (not shown) may alleviate lattice mismatch between the substrate 110 and the semiconductor layers. The buffer layer may have a form of a combination of a group III element and a group V element, or may include any one of AlN, AlGaN, InAlGaN, and AlInN. In the embodiment, the buffer layer may be AlN, but is not limited thereto. The buffer layer may include a dopant, but is not limited thereto.

A first conductive semiconductor layer 120 may be implemented with a group III-V or II-VI compound semiconductor and may be doped with a first dopant. The first conductive semiconductor layer 120 may be selected from semiconductor materials having a composition formula of $In_{x1}Al_{y1}Ga_{1-x1-y1}N$ ($0 \le x1 \le 1$, $0 < y1 \le 1$, and $0 \le x1+y1 \le 1$), for example, AlGaN, AlN, InAlGaN, and the like. Further, the first dopant may be an n-type dopant such as Si, Ge, Sn, Se, and Te. When the first dopant is an n-type dopant, the first conductive semiconductor layer 120 doped with the first dopant may be an n-type semiconductor layer.

An active layer 130 may be disposed between the first conductive semiconductor layer 120 and a second conductive semiconductor layer 140. The active layer 130 may be a layer in which electrons (or holes) injected through the first conductive semiconductor layer 120 and holes (or electrons) injected through the second conductive semiconductor layer 140 meet. In the active layer 130, the electrons and the holes may recombine and thus transition to a low energy level to generate light having an ultraviolet wavelength.

The active layer 130 may have one structure among a single well structure, a multiple well structure, a single quantum well structure, a multi quantum well (MQW) structure, a quantum dot structure, and a quantum wire structure, and the structure of the active layer 130 is not limited thereto.

The active layer 130 may include a plurality of well layers and a plurality of barrier layers. The well layers and the barrier layers may have a composition formula of $In_{x2}Al_{y2}Ga_{1-x2-y2}N$ ($0 \le x2 \le 1$, $0 < y2 \le 1$, and $0 \le x2+y2 \le 1$). The aluminum composition in the well layer may vary depending on a wavelength of light emitted from the well layer. The wavelength of light emitted from the well layer may become shorter as the aluminum composition becomes higher.

The second conductive semiconductor layer 140 may be formed on the active layer 130, may be implemented with a group III-V or II-VI compound semiconductor, and may be doped with a second dopant.

The second conductive semiconductor layer 140 may be formed of semiconductor materials having a composition formula of $In_{x5}Al_{y2}Ga_{1-x5-y2}N$ ($0 \le x5 \le 1$, $0 < y2 \le 1$, and $0 \le x5+y2 \le 1$), or a material selected from AlInN, AlGaAs, GaP, GaAs, GaAsP, and AlGaInP.

When the second dopant is a p-type dopant such as Mg, Zn, Ca, Sr, Ba, or the like, the second conductive semiconductor layer 140 doped with the second dopant may be a p-type semiconductor layer.

An electron-blocking layer (EBL) may be disposed between the active layer 130 and the second conductive semiconductor layer 140. The electron-blocking layer is a constraining layer of the active layer 130 and may reduce electron separation.

The light emitting structure (120, 130, and 140) may include an etched region P1 in which the first conductive semiconductor layer 120 is exposed as the active layer 130 and the second conductive semiconductor layer 140 are partially removed by mesa etching. The light emitting structure may include an intermediate layer 160 selectively regrown on the first conductive semiconductor layer 120 in the etched region P1.

The intermediate layer 160 may be a selectively regrown n-type ohmic semiconductor layer. An aluminum composition of the intermediate layer 160 may be smaller than that of the first conductive semiconductor layer 120. For example, the aluminum composition of the intermediate layer 160 may be 0% to 30% or 1% to 30%. The intermediate layer 160 may be GaN or AlGaN. According to this configuration, since an ohmic resistance of a first electrode 170 and the intermediate layer 160 is lowered, an operating voltage may be lowered.

The composition of the intermediate layer 160 may be the same as that of the first conductive semiconductor layer 120. For example, both the compositions of the first conductive semiconductor layer 120 and the intermediate layer 160 may have a composition formula of $In_{x1}Al_{y1}Ga_{1-x1-y1}N$ (0≤x1≤1, 0<y1≤1, and 0≤x1+y1≤1). In the intermediate layer 160, the first dopant (Si) may be included at a concentration of $1E17/cm^3$ to $1E20/cm^3$.

A first insulating layer 150 may include a first hole 150a which exposes the first conductive semiconductor layer 120 in the etched region P1. That is, the first insulating layer 150 may cover a part of the etched region P1 and expose the remaining part of the etched region P1 to control an area where the intermediate layer 160 is regrown. The first insulating layer 150 may include at least one selected from the group consisting of $SiO_2$, $Si_xO_y$, $Si_3N_4$, $Si_xN_y$, $SiO_xN_y$, $Al_2O_3$, $TiO_2$, AlN, and the like.

When a regrowth area is large, a regrowth rate is relatively fast, but a surface may be rough. On the other hand, when the regrowth area is narrow, the regrowth rate is relatively slow, but the surface may be smooth. Accordingly, according to the embodiment, a regrowth layer having a low surface roughness while regrowth is completed in a relatively fast time may be formed by adjusting an area of the first hole 150a.

According to the embodiment, a ratio of the area of the etched region P1 and the area of the first hole 150a may be 1:0.3 to 1:0.7. When the area ratio is smaller than 1:0.3 (for example, 1:0.2), since a growth area of the intermediate layer 160 decreases, it is difficult to inject current, and thus a voltage may increase. Further, when the area ratio is greater than 1:0.7 (for example, 1:0.8), there is a problem in that the growth area is too wide and thus surface roughness increases. When the surface roughness increases, the reflectance of the first electrode 170 may decrease or ohmic resistance may increase.

A thickness d1 of the intermediate layer 160 may be smaller than a thickness d2 of the first insulating layer 150. The thickness of the first insulating layer 150 may be 10 nm to 300 nm to effectively prevent moisture penetration and contamination. Further, the intermediate layer 160 may have a thickness of 10 nm to 150 nm, or 10 nm to 100 nm to lower a light absorption rate.

A ratio (d2:d1) of the thickness of the first insulating layer 150 and the thickness of the intermediate layer 160 may be 1:0.03 to 1:0.5. When the thickness ratio is less than 1:0.03, the intermediate layer 160 becomes too thin to achieve sufficient ohmic contact, and when the thickness ratio is larger than 1:0.5, since the intermediate layer 160 with a low aluminum composition becomes too thick, there is a problem in that an absorption rate of the ultraviolet light increases, and thus optical output becomes low. However, the present disclosure is not limited thereto, and the thickness of the intermediate layer 160 may be greater than the thickness of the first insulating layer 150.

The first conductive semiconductor layer 120 may include a first sub semiconductor layer 121, a second sub semiconductor layer 122 disposed on the first sub semiconductor layer 121, a third sub semiconductor layer 123 disposed on the second sub semiconductor layer 122, and a fourth sub semiconductor layer 124 disposed on the third sub semiconductor layer 123.

An aluminum composition of the second sub semiconductor layer 122 may be lower than aluminum compositions of the first sub semiconductor layer 121 and the fourth sub semiconductor layer 124, and an aluminum composition of the third sub semiconductor layer 123 may be lower than the aluminum composition of the second sub semiconductor layer 122.

For example, the aluminum compositions of the first sub semiconductor layer 121 and the fourth sub semiconductor layer 124 may be 70% to 90%, the aluminum composition of the second sub semiconductor layer 122 may be 55% to 70%, and the aluminum composition of the third sub semiconductor layer 123 may be 45% to 65%.

The intermediate layer 160 may be disposed on the third sub semiconductor layer 123 having the lowest aluminum composition to have improved current injection efficiency. In this case, the aluminum composition of the intermediate layer 160 may be lower than the aluminum composition of the third sub semiconductor layer 123.

The first electrode 170 may be disposed on the intermediate layer 160. The first electrode 170 may be formed of at least one of aluminum (Al), chromium (Cr), palladium (Pd), rhodium (Rh), platinum (Pt), titanium (Ti), nickel (Ni), gold (Au), indium (In), tin (Sn), tungsten (W), and copper (Cu).

For example, the first electrode 170 may include a first layer including at least one of Cr, Ti, and TiN and a second layer including at least one of Al, Rh, and Pt. However, the present disclosure is not limited thereto, and the first electrode 170 may include various structures and materials to effectively block the ultraviolet light emitted to the etched region P1. According to the embodiment, since the ultraviolet light is blocked by the first electrode, there is an effect of improving light extraction efficiency.

Referring to FIG. 2, the first electrode 170 may include a second extending portion 170a extending to an upper portion of the first insulating layer 150. According to this configuration, since a reflection area of the first electrode 170 is widened, light extraction efficiency may be improved. A width W3 of the second extending portion 170a may be 5 μm to 15 μm. When the width W3 is less than 5 μm, the intermediate layer 160 may be partially exposed when manufacturing tolerances occur, and when the width W3 is larger than 15 μm, there is a risk of occurrence of a short circuit between the first electrode 170 and a second electrode 180. The width W3 of the second extending portion may be smaller than the width of the first electrode 170.

The etched region P1 may include a first etched region P11 disposed at an inner side based on an outer side surface 170-1 of the first electrode 170 and a second etched region P12 disposed at an outer side based on the outer side surface 170-1 of the first electrode 170. The first etched region P11 is may be a region between an outer side of the light emitting region and the outer side surface 170-1 of the first electrode 170, and the second etched region P12 may be a dummy region considering tolerance. A ratio of an area of the first etched region P11 and an area W1 of the intermediate layer 160 may be 1:0.3 to 1:0.7. When the area ratio is smaller than 1:0.3 (for example, 1:0.2), since the area of the intermediate layer 160 is small, the area which is in ohmic contact with the first electrode 170 may decrease. Further, when the area ratio is greater than 1:0.7 (for example, 1:0.8), since the area of the intermediate layer 160 may be too wide, the light absorption rate may increase. In addition, when the growth area is too wide, since surface roughness increases, ohmic contact may become poor and reflectance of the first electrode 170 may decrease.

A ratio of the area of the first etched region P11 and an area W4 of the first electrode 170 may be 1:0.4 to 1:0.9. When the area ratio is less than 1:0.4, the first electrode 170 may not sufficiently cover the intermediate layer 160 and thus light extraction efficiency may be degraded. Further, when the area ratio is greater than 1:0.9 (for example, 1:0.95), there is a risk of occurrence of a short circuit between the first electrode 170 and the second electrode 180. Accordingly, the area of the first electrode may be larger than the area of the intermediate layer.

Referring to FIG. 3, the intermediate layer 160 may have a superlattice structure in which a first intermediate layer 160a and a second intermediate layer 160b having different aluminum compositions are stacked multiple times. The aluminum composition of the first intermediate layer 160a may be higher than the aluminum composition of the second intermediate layer 160b. The first intermediate layer 160a and the second intermediate layer 160b may each have a thickness of 5 nm to 10 nm, but are not limited thereto.

The first intermediate layer 160a may satisfy a composition formula of $Al_xGa_{1-x}N$ ($0.6 \le x \le 1$), and the second intermediate layer 160b may satisfy a composition formula of $Al_yGa_{1-y}N$ ($0 \le y \le 0.5$). For example, the first intermediate layer 160a may be AlGaN and the second intermediate layer 160b may be GaN. However, the present disclosure is not limited thereto, and both the first intermediate layer 160a and the second intermediate layer 160b may be AlGaN.

According to this superlattice configuration, it is possible to improve element stability by reducing stress due to lattice mismatch while minimizing ultraviolet light absorption.

Referring to FIG. 4, the first insulating layer 150 may include a first extending portion 151 extending to an upper portion of the intermediate layer 160. According to this configuration, there is an advantage in that the area of the intermediate layer 160 electrically connected to the first electrode 170 may be adjusted by adjusting a width W5 of the first extending portion 151.

Further, according to this configuration, since a reflective electrode is disposed on the first extending portion 151 of the first insulating layer 150, reflectance may be increased through an omni directional reflector (ODR) effect.

FIG. 5 is a plan view illustrating an intermediate layer, FIG. 6 is a plan view illustrating a first electrode, and FIG. 7 is a plan view of the light emitting element according to one embodiment of the present disclosure.

Referring to FIG. 5, a plurality of light emitting regions P2 may extend in a first direction (an X-axis direction) and may be disposed to be spaced apart from each other in a second direction (a Y-axis direction) by mesa etching. The etched region P1 may be disposed to surround the plurality of light emitting regions P2.

Since an ultraviolet semiconductor device has a relatively high probability of light emission in a transverse magnetic mode (TM) which emits light to the side surface compared to a semiconductor device which emits blue light, it may be advantageous to widen a side surface of the active layer as much as possible. Accordingly, since the light emitting region P2 is separated into a plurality, the exposed area of the active layer may be increased, and thus the extraction efficiency of light emitted to the side surface may be increased. In the embodiment, a case in which the number of the plurality of light emitting regions P2 is three is disclosed, but the number of light emitting regions P2 is not particularly limited.

The intermediate layer 160 may include a plurality of finger portions 161 disposed between the plurality of light emitting regions P2 and each having a first end 161a and a second end 161b and an edge portion 162 surrounding the plurality of light emitting regions P2. The edge portion 162 may be connected to the first end 161a and the second end 161b of each of the plurality of finger portions 161. A width of each of the finger portions 161 and the edge portion 162 may be 10 μm to 40 μm, but is not limited thereto.

Each of the plurality of light emitting regions P2 may include a first end P21 and a second end P22, and the first end P21 of each of the plurality of light emitting regions P2 may include curved portions R1 that are curved in a direction in which facing surfaces are away from each other. The first end 161a of the finger portion 161 may be disposed between the curved portions R1 of the light emitting region P2.

Since the plurality of light emitting regions P2 are curved in the directions in which the curved portions R1 recede from each other (the Y-axis direction), a width W31 of the first end P21 may become smaller than a width W32 of the second end P22. Accordingly, in each of the plurality of finger portions 161, a width W21 of the first end 161a may be formed larger than a width W22 of the second end 161b.

Referring to FIG. 6, the first electrode 170 may be disposed on the intermediate layer 160. A shape of the first electrode 170 may correspond to a shape of the intermediate layer 160. The first electrode 170 may include a plurality of finger electrodes 171 disposed between the plurality of light emitting regions P2 and each having a first end 171a and a second end 171b and an edge electrode 172 extending along an edge of the first etched region P11. The edge electrode 172 may be connected to the first end 171a and the second end 171b of each of the plurality of finger electrodes 171. In this case, in each of the plurality of finger electrodes 171, a width W41 of the first end 171a may be wider than a width W42 of the second end 171b.

The ratio of the area of the first etched region P11 and the area of the intermediate layer 160 may be 1:0.3 to 1:0.7. As described above, the first etched region P11 may be a region between the light emitting region P2 and the outer side surface 170-1 of the first electrode 170.

When the area ratio is smaller than 1:0.3 (for example, 1:0.2), since the area of the intermediate layer 160 is small, an area which is in ohmic contact with the first electrode 170 may decrease. Accordingly, the operating voltage may increase. Further, when the area ratio is greater than 1:0.7 (for example, 1:0.8), since the area of the intermediate layer 160 is too wide, the light absorption rate may increase. In addition, when the growth area is too wide, since the surface roughness increases, the ohmic contact may become poor and the reflectance of the first electrode 170 may decrease.

The ratio of the area of the first etched region P11 and the area of the first electrode 170 may be 1:0.4 to 1:0.9. When the area ratio is less than 1:0.4, the first electrode 170 may not sufficiently cover the intermediate layer 160 and thus light extraction efficiency may be degraded. Further, when the area ratio is greater than 1:0.9 (for example, 1:1.2), there is a risk of occurrence of a short circuit due to connection of the first electrode 170 and the second electrode 180.

Referring to FIGS. 6 and 7, the light emitting element according to the embodiment may include a second insulating layer 152 disposed on the first electrode 170 and the second electrode 180, a first pad 191 disposed on the second insulating layer 152 and electrically connected to the first electrode 170 through a first opening 152a, and a second pad 192 disposed on the second insulating layer 152 and electrically connected to the second electrode 180 through a second opening 152b.

The second insulating layer 152 may entirely cover the first electrode 170 and the second electrode 180 and expose only portions of the first electrode 170 and the second electrode 180. The first opening 152a which exposes the first electrode 170 may be formed on the first end 171a of the finger electrode 171 of the first electrode 170. As described above, since the first end 171a of the finger electrode 171 of the first electrode 170 is formed to have a relatively great width, the first opening 152a may be formed to be wide to increase a contact area between the first pad 191 and the first electrode 170.

The second opening 152b of the second insulating layer 152 may be disposed on the second electrode 180. The second electrode 180 may be disposed on each of the plurality of light emitting regions P2 and the second opening 152b may overlap each of the plurality of second electrodes 180.

Since the first openings 152a are disposed between the plurality of light emitting regions P2 and the second openings 152b are respectively disposed on the plurality of light emitting regions P2, the number of first openings 152a may be less than the number of second openings 152b. Further, an area of the first opening 152a may be smaller than an area of the second opening 152b.

The first pad 191 and the second pad 192 may extend in the second direction (the Y-axis direction), and may be disposed to be spaced apart from each other in the first direction (the X-axis direction). The first pad 191 may be disposed to overlap the curved portions R1 and the first ends 171a of the plurality of light emitting regions P2.

FIGS. 8A and 8B are a plan view and a cross-sectional view illustrating a state in which the light emitting region and the etched region are formed by the mesa etching, respectively, FIGS. 9A and 9B are a plan view and a cross-sectional view illustrating a state in which the intermediate layer is regrown on the first conductive semiconductor layer, respectively, FIGS. 10A and 10B are a plan view and a cross-sectional view illustrating a state in which the first electrode is formed, respectively, and FIGS. 11A and 11B are a plan view and a cross-sectional view illustrating a state in which the second electrode is formed, respectively.

Referring to FIGS. 8A and 8B, the plurality of light emitting regions P2 may extend in the first direction and may be disposed to be spaced apart from each other in the second direction by mesa etching. The etched region P1 may be disposed to surround the plurality of light emitting regions P2. In the embodiment, the case in which the number of the plurality of light emitting regions P2 is three is disclosed, but the number of light emitting regions P2 is not particularly limited.

The light emitting structure on the substrate may be epitaxially grown through methods such as metal organic chemical vapor deposition (MOCVD), chemical vapor deposition (CVD), physical vapor deposition (PVD), atomic layer deposition (ALD), and the like.

Referring to FIGS. 9A and 9B, in the first insulating layer 150, the first hole 150a which exposes the first conductive semiconductor layer 120 in the etched region P1 may be formed, and the intermediate layer 160 may be regrown thereon.

When a regrowth area is large, regrowth becomes relatively fast, but a surface may be rough. On the other hand, when the regrowth area is narrow, the regrowth becomes relatively slow, but the surface may be smooth. Accordingly, according to the embodiment, the intermediate layer 160 having a low surface roughness while regrowth is completed in a relatively fast time may be formed by adjusting the area of the first hole 150a.

The intermediate layer 160 may be epitaxially grown through methods such as metal organic chemical vapor deposition (MOCVD), chemical vapor deposition (CVD), physical vapor deposition (PVD), atomic layer deposition (ALD), and the like. In this case, the dopant may be doped at a concentration of $1E17/cm^3$ to $1E20/cm^3$.

The thickness of the intermediate layer 160 may be smaller than the thickness of the first insulating layer 150. The thickness of the first insulating layer 150 may be 10 nm to 300 nm to effectively prevent moisture penetration or the like. Further, the intermediate layer 160 may be grown to 10 nm to 150 nm to lower the light absorption rate. Accordingly, a ratio of the thickness of the first insulating layer 150 and the thickness of the intermediate layer 160 may be 1:0.03 to 1:0.5. However, the present disclosure is not limited thereto, and the thickness of the intermediate layer 160 may be greater than the thickness of the first insulating layer 150.

Referring to FIGS. 10A and 10B, the first electrode 170 may be formed on the intermediate layer 160. The first electrode 170 may be formed of at least one of aluminum (Al), chromium (Cr), palladium (Pd), rhodium (Rh), platinum (Pt), titanium (Ti), nickel (Ni), gold (Au), indium (In), tin (Sn), tungsten (W), and copper (Cu).

For example, the first electrode 170 may include a first layer including at least one of Cr, Ti, and TiN and a second layer including at least one of Al, Rh, and Pt. However, the present disclosure is not limited thereto, and the first electrode 170 may include various structures and materials to effectively block the ultraviolet light emitted to the etched region P1.

Referring to FIGS. 11A and 11B, the second electrode 180 may be formed on the second conductive semiconductor layer 140. The second electrode 180 may include at least one of Al, Cr, Pd, Rh, Pt, Ti, Ni, and Au. However, the present disclosure is not limited thereto, and the regrown intermediate layer 160 may also be formed on the second conductive semiconductor layer 140 like the case in which the intermediate layer 160 is formed on the first conductive semiconductor layer 120. In this case, the intermediate layer 160 may be a P-type regrowth layer.

FIGS. 12A and 12B are graphs for describing an effect of improving an electrical characteristic (VF enhancement) and an optical characteristic (optical output enhancement) of a short wavelength ultraviolet light emitting diode (LED) (a peak wavelength of 265 nm) according to one embodiment of the present disclosure.

As shown in FIG. 12A, it can be seen that a short wavelength ultraviolet light emitting element with an intermediate layer has an improved electrical characteristic (VF reduction) compared to the element without the intermediate layer.

Further, as shown in FIG. 12B, in the case of a short wavelength ultraviolet light emitting element in which the intermediate layer was selectively regrown, it can be seen that reflectance of a metal electrode increased by forming ohmic contact without an alloy through high-temperature heat treatment, and thus the optical characteristic (optical output enhancement) was improved.

FIG. 13 is a conceptual diagram of a light emitting element according to another embodiment of the present disclosure, and FIG. 14 is a view illustrating inclination angles of a buffer layer and a first conductive semiconductor layer.

A substrate 210 may be formed of a material selected from sapphire ($Al_2O_3$), SiC, GaAs, GaN, ZnO, Si, GaP, InP, and Ge, but is not limited thereto. The substrate 210 may be a transparent substrate through which light in an ultraviolet wavelength band may be transmitted.

A buffer layer 211 may alleviate lattice mismatch between the substrate 210 and the semiconductor layers. The buffer layer 211 may have a form of a combination of a group III element and a group V element, or may include any one of AlN, AlGaN, InAlGaN, and AlInN. In the embodiment, the buffer layer 211 may be AlN, but is not limited thereto. The buffer layer 211 may include a dopant, but is not limited thereto.

A first conductive semiconductor layer 220 may be implemented with a group III-V or II-VI compound semiconductor and may be doped with a first dopant. The first conductive semiconductor layer 220 may be selected from semiconductor materials having a composition formula of $In_{x1}Al_{y1}Ga_{1-x1-y1}N$ ($0 \leq x1 \leq 1$, $0 \leq y1 \leq 1$, and $0 \leq x1+y1 \leq 1$), for example, AlGaN, AlN, InAlGaN, and the like. Further, the first dopant may be an n-type dopant such as Si, Ge, Sn, Se, and Te. When the first dopant is an n-type dopant, the first conductive semiconductor layer 120 doped with the first dopant may be an n-type semiconductor layer.

An active layer 230 may be disposed between the first conductive semiconductor layer 220 and a second conductive semiconductor layer 240. The active layer 230 may be a layer in which electrons (or holes) injected through the first conductive semiconductor layer 220 and holes (or electrons) injected through the second conductive semiconductor layer 240 meet. In the active layer 230, the electrons and the holes may recombine and thus transition to a low energy level to generate light having an ultraviolet wavelength.

The active layer 230 may have one structure among a single well structure, a multiple well structure, a single quantum well structure, a multi quantum well (MQW) structure, a quantum dot structure, and a quantum wire structure, and the structure of the active layer 230 is not limited thereto.

The active layer 230 may include a plurality of well layers and a plurality of barrier layers. The well layers and the barrier layers may have a composition formula of $In_{x2}Al_{y2}Ga_{1-x2-y2}N$ ($0 \leq x2 \leq 1$, $0 \leq y2 \leq 1$, and $0 \leq x2+y2 \leq 1$). The aluminum composition in the well layer may vary depending on a wavelength of light emitted from the well layer. The wavelength of light emitted from the well layer may become shorter as the aluminum composition becomes higher.

The second conductive semiconductor layer 240 may be formed on the active layer 230, may be implemented with a group III-V or II-VI compound semiconductor, and may be doped with a second dopant.

The second conductive semiconductor layer 240 may be formed of semiconductor materials having a composition formula of $In_{x5}Al_{y2}Ga_{1-x5-y2}N$ ($0 \leq x5 \leq 1$, $0 < y2 \leq 1$, and $0 \leq x5+y2 \leq 1$), or a material selected from AlInN, AlGaAs, GaP, GaAs, GaAsP, and AlGaInP.

When the second dopant is a p-type dopant such as Mg, Zn, Ca, Sr, Ba, or the like, the second conductive semiconductor layer 240 doped with the second dopant may be a p-type semiconductor layer.

An electron-blocking layer (EBL) may be disposed between the active layer 230 and the second conductive semiconductor layer 240. The electron-blocking layer is a constraining layer of the active layer 230 and may reduce electron separation.

A light emitting structure P may include an etched region P1 which partially exposes the first conductive semiconductor layer 220 and the buffer layer 211. The etched region P1 may include a first etched region W62 which exposes the first conductive semiconductor layer 220 and a second etched region W63 which exposes the buffer layer 211. The second etched region W63 may be formed to surround the first etched region W62.

The second etched region W63 may be formed after the first etched region W62 is formed, but the present disclosure is not limited thereto, and the first etched region W62 and the second etched region W63 may be simultaneously formed. Further, various semiconductor etching methods such as dry etching or wet etching may be used as an etching method.

A depth d61 of the first etched region W62 and a depth d62 of the second etched region W63 may be different. The depth d62 of the second etched region W63 may be greater than the depth d61 of the first etched region W62. For example, a ratio (d61:d62) of the depth d61 of the first etched region W62 and the depth d62 of the second etched region W63 may be 1:4 to 1:9.

When the depth ratio is less than 1:4 (for example, 1:3), a portion of the first conductive semiconductor layer may remain and thus it may become vulnerable to corrosion, and when the depth ratio is greater than 1:9, a process time increases and a step difference increases, and thus productivity may decrease. Further, stability in the following photolithography process may decrease.

Referring to FIG. 14, a first height d621 of a side surface of the first conductive semiconductor layer 220 exposed by the second etched region W63 may be greater than a second height d622 of a side surface of the buffer layer 211 exposed by the second etched region W63. When the depth d62 of the second etched region W63 increases, since the buffer layer 211 is etched more, the second height d622 may increase. A ratio (d621:d622) of the first height d621 and the second height d622 may be 1:0.1 to 1:1.

When the height ratio is less than 1:0.1, the n-type semiconductor may remain and thus it may become vulnerable to corrosion, and when the height ratio is greater than 1:1, productivity may decrease due to an increase in process time.

A first inclination angle θ2 of the side surface of the first conductive semiconductor layer 220 exposed to the second etched region W63 may be larger than a second inclination angle θ1 of the side surface of the buffer layer 211 exposed by the second etched region W63. This is because compositions of the first conductive semiconductor layer 220 and the buffer layer 211 are different even when the same etching gas or etching solution is used. For example, the first inclination angle θ2 of the side surface of the first conductive semiconductor layer 220 may be 40 degrees to 65 degrees. Further, the second inclination angle θ1 of the side surface of the buffer layer 211 exposed by the second etched region W63 may be 30 degrees to 60 degrees.

Referring to FIG. 13, a first electrode 261 may be disposed on the first conductive semiconductor layer 220 disposed in the first etched region W62. The first electrode 261 may be formed of at least one of aluminum (Al), chromium (Cr), palladium (Pd), rhodium (Rh), platinum (Pt), titanium (Ti), nickel (Ni), gold (Au), indium (In), tin (Sn), oxide (O), tungsten (W), and copper (Cu).

For example, the first electrode 261 may include a first layer including at least one of Cr, Ti, and TiN and a second layer including at least one of Al, Rh, and Pt. However, the present disclosure is not limited thereto As described in FIG. 1, the intermediate layer (160 in FIG. 1) regrown from the first conductive semiconductor layer may be formed under the first electrode 261. Like the above, the intermediate layer regrown from the second conductive semiconductor layer may also be formed under the second electrode.

A first cover electrode 262 may be disposed on the first electrode 261. The first cover electrode 262 may be formed to cover the first electrode 261. A material of the first cover electrode 262 may be the same as that of the first electrode 261, but is not limited thereto. The first cover electrode 262 may include various structures and materials to effectively block the ultraviolet light emitted to the etched region P1. According to the embodiment, since the ultraviolet light is blocked by the first electrode 261 or the first cover electrode 262, there is an effect of improving light extraction efficiency.

A second electrode 271 may be disposed on the second conductive semiconductor layer 240. The second electrode 271 may be formed of at least one of aluminum (Al), chromium (Cr), palladium (Pd), rhodium (Rh), platinum (Pt), titanium (Ti), nickel (Ni), gold (Au), indium (In), tin (Sn), oxide (O), tungsten (W), and copper (Cu), but is not limited thereto.

A second cover electrode 272 and a reflective electrode 273 may be disposed on the second electrode 271. A material of each of the second cover electrode 272 and the reflective electrode 273 may be the same as that of the second electrode 271, but is not limited thereto. The second cover electrode 272 may be formed to cover the second electrode 271. The second electrode 271, the second cover electrode 272, and the reflective electrode 273 may be made of a material which reflects light emitted to the second conductive semiconductor layer 240. However, in a horizontal structure, the second electrode 271 and the second cover electrode 272 may be made of a material which transmits the ultraviolet light, and the reflective electrode may be omitted.

A first insulating layer 251 may be formed between the first electrode 261 and the second electrode 271. The first insulating layer 251 may include at least one selected from the group consisting of $SiO_2$, $Si_xO_y$, $Si_3N_4$, $Si_xN_y$, $SiO_xN_y$, $Al_2O_3$, $TiO_2$, AlN, and the like. The first insulating layer 251 may be formed before the second etched region W63 is formed, but is not limited thereto, and may be formed after the second etched region W63 is formed.

A second insulating layer 252 may be formed on the first electrode 261 and the second electrode 271. A material of the second insulating layer 252 may be the same as that of the first insulating layer 251. The second insulating layer 252 may be thicker than the first insulating layer 251, but is not limited thereto. A boundary between the first insulating layer 251 and the second insulating layer 252 may disappear in a final product.

The second etched region W63 may include a cover region W65 in which the second insulating layer 252 is formed and a dummy region W64 in which the second insulating layer 252 is not formed. The dummy region W64 may be a region for cutting chips. Accordingly, the dummy region W64 may or may not be formed in the final product stage depending on a cutting condition.

An area of the first etched region W62 and an area of the cover region W65 may be different. A ratio (W65:W62) of the area of the cover region W65 and the area of the first etched region W62 may be 1:3.5 to 1:6.

When the area ratio is greater than 1:6 (for example, 1:7), since the area of the insulating layer disposed in the second etched region W63 becomes small, a problem in that the side surface of the first conductive semiconductor layer may not be sufficiently covered may occur, and when the area ratio is smaller than 1:3.5, since an end of the insulating layer may come into contact with a cut surface or crack during chip cutting, a defect may occur.

FIG. 15 is a cross-sectional view of the light emitting element according to another embodiment of the present disclosure.

Referring to FIG. 15, a side surface 252-1 of the second insulating layer 252 may be disposed in the cover region W65 of the second etched region W63 to surround the light emitting structure P. According to this configuration, since the second insulating layer 252 entirely covers the side surface of the first conductive semiconductor layer 220, it is possible to prevent the side surface of the first conductive semiconductor layer 220 from being corroded.

The second insulating layer 252 may include a first opening 252a which exposes the first cover electrode 262 and a second opening 252b which exposes the second cover electrode 272. A first pad 291 may be electrically connected to the first cover electrode 262 and the first electrode 261 through the first opening 252a, and a second pad 292 may be electrically connected to the second cover electrode 272 and the second electrode 271 through second opening 252b.

This pad structure may be a flip chip structure. However, the embodiment is not limited to the flip chip structure, and a horizontal structure may also be applied.

Referring to FIG. 16, the side surface 252-1 of the second insulating layer 252 may be patterned to have a protruding shape. According to this configuration, it is possible to restrain the propagation of cracks generated in the chip up to the active layer. When the side surface 252-1 of the second insulating layer 252 is straight, the cracks may extend to the active layer through the insulating layer. However, when the side surface 252-1 of the second insulating layer 252 is curved, the propagation of the cracks may be effectively restrained.

Referring to FIGS. 17A to 17E, protrusions PT1 on the side surface of the second insulating layer 252 may have various curved shapes. For example, outwardly convex protrusions PT1 may be included as shown in FIG. 17A, and a straight portion PT2 may be disposed between the plurality of convex protrusions PT1 as shown in FIG. 17B. Widths of the protrusions PT1 and the straight portion PT2 may be the same or different. For example, the widths of the protrusions PT1 and the straight portion PT2 may be 3 μm to 15 μm, but are not limited thereto.

Referring to FIG. 17C, the side surface of the second insulating layer 252 may include concave protrusions PT3, and as shown in FIG. 17D, the straight portion PT2 may be disposed between the plurality of concave protrusions PT3. Further, as shown in FIG. 17E, the side surface of the second insulating layer 252 may have a structure in which the convex protrusions PT1 and the concave protrusions PT3 are mixed.

According to the above-described various embodiments of the present disclosure, the ultraviolet light emitting element may be designed to enable ohmic contact regardless of the aluminum composition ratio of the n-type semiconductor layer.

The ultraviolet light emitting element may be applied to various types of light source devices. For example, the light source device may be a concept including a sterilization device, a curing device, a lighting device, a display device, a vehicle lamp, and the like. That is, the ultraviolet light emitting element may be applied to various electronic devices disposed in a case (body) to provide light.

The sterilization device may sterilize a desired region by including the ultraviolet light emitting element according to the embodiment. The sterilization device may be applied to household appliances such as a water purifier, an air conditioner, a refrigerator, and the like, but is not limited thereto. That is, the sterilization device may be applied to all of various products (for example, a medical device) which require sterilization.

For example, the water purifier may be provided with the sterilization device according to the embodiment to sterilize circulating water. The sterilization device is disposed in a nozzle or an outlet through which the water circulates to irradiate ultraviolet rays. In this case, the sterilization device may include a waterproof structure.

The curing device may cure various types of liquid by including the ultraviolet light emitting element according to the embodiment. The liquid may be the broadest concept including all of various materials which are cured when irradiated with ultraviolet rays. For example, the curing device may cure various types of resins. Alternatively, the curing device may be applied to cure cosmetic products such as a manicure.

The lighting device may include a light source module including a substrate and the ultraviolet light emitting element of the embodiment, a heat dissipation part which dissipates heat from the light source module, and a power supply part which processes or converts an electrical signal provided from the outside to provide the electrical signal to the light source module. Further, the lighting device may include a lamp, a head lamp, a street light, or the like.

The display device may include a bottom cover, a reflective plate, a light emitting module, a light guide plate, an optical sheet, a display panel, an image signal output circuit, and a color filter. The bottom cover, the reflective plate, the light emitting module, the light guide plate, and the optical sheet may constitute a backlight unit.

According to an embodiment, an operating voltage of an ultraviolet light emitting element can be lowered by lowering an ohmic resistance between a semiconductor layer and an electrode.

Further, an ultraviolet light emitting element whose optical output is improved can be manufactured.

In addition, chip reliability can be improved by improving a problem in that a side surface of the ultraviolet light emitting element is corroded.

In addition, a problem that cracks are generated on the side surface of the ultraviolet light emitting element and propagate can be improved, and thus chip reliability can be improved. In addition, there is an advantage of easy chip cutting.

Various useful advantages and effects of the present disclosure are not limited to the above and can be relatively easily understood in a process of describing exemplary embodiments of the present disclosure.

It is the intent of the Applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. An ultraviolet light emitting element comprising:
   a light emitting structure including a first conductive semiconductor layer, a second conductive semiconductor layer, an active layer disposed between the first conductive semiconductor layer and the second conductive semiconductor layer, and an etched region in which the first conductive semiconductor layer is exposed;
   a first insulating layer disposed on the light emitting structure and including a first hole which exposes a portion of the etched region;
   a first electrode electrically connected to the first conductive semiconductor layer; and
   a second electrode electrically connected to the second conductive semiconductor layer,
   wherein the light emitting structure includes an intermediate layer regrown on the first conductive semiconductor layer exposed in the first hole, the first electrode is disposed on the intermediate layer,
   wherein the light emitting structure includes a plurality of light emitting regions extending in a first direction and spaced apart from each other in a second direction perpendicular to the first direction,
   wherein each of the plurality of light emitting regions includes a first end and a second end,
   wherein the first end of each of the plurality of light emitting regions includes curved portions curved in directions receding from each other, and
   wherein the first pad overlaps the curved portions of the plurality of light emitting regions.

2. The ultraviolet light emitting element of claim 1, wherein a thickness of the intermediate layer is smaller than a thickness of the first insulating layer.

3. The ultraviolet light emitting element of claim 2, wherein a ratio of the thickness of the first insulating layer and the thickness of the intermediate layer is 1:0.03 to 1:0.5.

4. The ultraviolet light emitting element of claim 1, wherein the first insulating layer includes a first extending portion extending to an upper portion of the intermediate layer.

5. The ultraviolet light emitting element of claim 1, wherein:
   the first electrode includes a second extending portion extending to an upper portion of the first insulating layer; and
   a width of the second extending portion is 5 μm to 15 μm.

6. The ultraviolet light emitting element of claim 1, wherein:
   first intermediate layers and second intermediate layers having different aluminum compositions are stacked multiple times in the intermediate layer; and
   the aluminum composition of each of the first intermediate layers is higher than the aluminum composition of each of the second intermediate layers.

7. The ultraviolet light emitting element of claim 1, wherein:
   the intermediate layer includes a plurality of finger portions disposed between the plurality of light emitting regions and each having a first end and a second end, and an edge portion surrounding the plurality of light emitting regions; and
   the edge portion is connected to the first ends and the second ends of the plurality of finger portions.

8. The ultraviolet light emitting element of claim 7, wherein a width of the first end is greater than a width of the second end in each of the plurality of finger portions.

9. The ultraviolet light emitting element of claim 8, wherein:

the first electrode includes a plurality of finger electrodes disposed between the plurality of light emitting regions and each having a first end and a second end, and an edge electrode surrounding the plurality of light emitting regions;

the edge electrode is connected to the first ends and the second ends of the plurality of finger electrodes; and a width of the first end is greater than a width of the second end in each of the plurality of finger electrodes.

10. The ultraviolet light emitting element of claim 9, comprising:

a second insulating layer disposed on the first electrode and the second electrode, and including a first opening which exposes the first electrode and a second opening which exposes the second electrode;

a first pad disposed on the second insulating layer and electrically connected to the first electrode through the first opening; and a second pad disposed on the second insulating layer and electrically connected to the second electrode through the second opening.

11. The ultraviolet light emitting element of claim 10, wherein:

the first opening is disposed on the first end of the finger portion; and the second opening is disposed on the second electrode.

12. An ultraviolet light emitting element comprising:

a light emitting structure including a first conductive semiconductor layer, a second conductive semiconductor layer, an active layer disposed between the first conductive semiconductor layer and the second conductive semiconductor layer, and an etched region in which the first conductive semiconductor layer is exposed;

a first insulating layer disposed on the light emitting structure and including a first hole which exposes a portion of the etched region;

a first electrode electrically connected to the first conductive semiconductor layer; and a second electrode electrically connected to the second conductive semiconductor layer, wherein the light emitting structure includes an intermediate layer regrown on the first conductive semiconductor layer exposed in the first hole, the first electrode is disposed on the intermediate layer, wherein:

the first conductive semiconductor layer includes a first sub semiconductor layer, a second sub semiconductor layer disposed on the first sub semiconductor layer, a third sub semiconductor layer disposed on the second sub semiconductor layer, and a fourth sub semiconductor layer disposed on the third sub semiconductor layer;

an aluminum composition of the second sub semiconductor layer is lower than aluminum compositions of the first sub semiconductor layer and the fourth sub semiconductor layer;

an aluminum composition of the third sub semiconductor layer is lower than the aluminum composition of the second sub semiconductor layer; and the intermediate layer is disposed on the third sub semiconductor layer.

13. The ultraviolet light emitting element of claim 12, wherein an aluminum composition of the intermediate layer is lower than the aluminum composition of the third sub semiconductor layer.

* * * * *